United States Patent
Park et al.

(10) Patent No.: US 12,101,923 B2
(45) Date of Patent: Sep. 24, 2024

(54) SEMICONDUCTOR DEVICE INCLUDING GATE STRUCTURE HAVING FIRST PORTION AND SECOND PORTION AND METHOD FOR MANUFACTURING THE SAME

(71) Applicant: Samsung Electronics Co., Ltd., Suwon-si (KR)

(72) Inventors: Jaewha Park, Yongin-si (KR); Moonkeun Kim, Hwaseong-si (KR); Sukhoon Kim, Hwaseong-si (KR); Dongchan Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/207,689

(22) Filed: Jun. 9, 2023

(65) Prior Publication Data

US 2023/0397393 A1  Dec. 7, 2023

Related U.S. Application Data

(63) Continuation of application No. 17/520,868, filed on Nov. 8, 2021, now Pat. No. 11,700,722.

(30) Foreign Application Priority Data

Apr. 22, 2021 (KR) .......................... 10-2021-0052343

(51) Int. Cl.
H10B 12/00 (2023.01)

(52) U.S. Cl.
CPC ......... *H10B 12/053* (2023.02); *H10B 12/315* (2023.02); *H10B 12/34* (2023.02); *H10B 12/482* (2023.02)

(58) Field of Classification Search
CPC .... H10B 12/053; H10B 12/315; H10B 12/34; H10B 12/482
USPC ......................................................... 257/330
See application file for complete search history.

(56) References Cited

U.S. PATENT DOCUMENTS

| | | | |
|---|---|---|---|
| 7,767,565 B2 | 8/2010 | Chung | |
| 8,288,263 B2 | 10/2012 | Kim et al. | |
| 9,318,369 B2 | 4/2016 | Park | |
| 10,115,640 B2 | 10/2018 | Hwang et al. | |
| 10,395,973 B2 | 8/2019 | Kim et al. | |
| 2012/0056263 A1 | 3/2012 | Lee et al. | |

(Continued)

FOREIGN PATENT DOCUMENTS

KR  101965862 B1  4/2019

OTHER PUBLICATIONS

Office Action for corresponding patent application No. TW 110142666 dated Apr. 13, 2023.

*Primary Examiner* — Hoai V Pham
(74) *Attorney, Agent, or Firm* — Muir Patent Law, PLLC

(57) ABSTRACT

A semiconductor device manufacturing method according to the exemplary embodiments of the disclosure includes patterning a substrate, thereby forming an active pattern, forming a trench penetrating the active pattern, forming a support layer covering the trench, forming a first opening at the support layer, forming a gate electrode layer filling the trench through the first opening, and forming a bit line structure electrically connected to the active pattern. The support layer includes a base portion covering a top surface of the active pattern, and a support disposed in the trench.

14 Claims, 31 Drawing Sheets

(56) References Cited

U.S. PATENT DOCUMENTS

| | | |
|---|---|---|
| 2013/0196477 A1 | 8/2013 | Kang |
| 2014/0061850 A1 | 3/2014 | Cho et al. |
| 2019/0355727 A1 | 11/2019 | Lee et al. |
| 2020/0176451 A1* | 6/2020 | Kang ................. H01L 21/28105 |
| 2020/0286897 A1* | 9/2020 | Panda .................. H10B 12/488 |

* cited by examiner

SEMICONDUCTOR DEVICE INCLUDING GATE STRUCTURE HAVING FIRST PORTION AND SECOND PORTION AND METHOD FOR MANUFACTURING THE SAME

CROSS-REFERENCE TO THE RELATED APPLICATION

This application is a continuation of U.S. patent application Ser. No. 17/520,868 filed Nov. 8, 2021, which claims priority under 35 U.S.C. § 119 to Korean Patent Application No. 10-2021-0052343, filed on Apr. 22, 2021, in the Korean Intellectual Property Office, the disclosure of each of which is incorporated herein by reference in its entirety.

BACKGROUND

1. Field

The exemplary embodiments of the disclosure relate to a semiconductor device and a method for manufacturing the same. In particular, the exemplary embodiments of the disclosure relate to a semiconductor device including a gate structure and a method for manufacturing the same.

2. Description of the Related Art

Semiconductor devices are being highlighted in the electronics industry due to characteristics thereof such as miniaturization, multifunctionalization, low manufacturing costs, etc. Semiconductor devices may be classified into a semiconductor memory device to store logic data, a semiconductor logic device to arithmetically process logic data, and a hybrid semiconductor device including a memory element and a logic element. As the electronics industry advances, demand for improved characteristics of semiconductor devices is gradually increasing. For example, demand for high reliability, high speed, multifunctionalization, etc. of semiconductor devices is gradually increasing. In order to satisfy such demand of improved characteristics, structures in semiconductor devices become more and more complicated. In addition, semiconductor devices become more and more highly integrated.

SUMMARY

The exemplary embodiments of the disclosure reduce difficulty of a process for manufacturing a semiconductor device.

A method for manufacturing a semiconductor device in accordance with some exemplary embodiments of the disclosure includes patterning a substrate, thereby forming an active pattern, forming a trench penetrating the active pattern, forming a support layer covering the trench, forming a first opening at the support layer, forming a gate electrode layer filling the trench through the first opening, and forming a bit line structure electrically connected to the active pattern. The support layer includes a base portion covering a top surface of the active pattern, and a support portion disposed in the trench.

A method for manufacturing a semiconductor device in accordance with some exemplary embodiments of the disclosure includes patterning a substrate, thereby forming an active pattern, forming a trench penetrating the active pattern, forming a support layer on the active pattern, forming a first opening at the support layer, forming a gate electrode layer filling the trench through the first opening, and forming a bit line structure electrically connected to the active pattern. The support layer and the gate electrode layer include the same conductive material.

A method for manufacturing a semiconductor device in accordance with some exemplary embodiments of the disclosure includes patterning a substrate, thereby forming an active pattern, forming a trench penetrating the active pattern, forming a preliminary barrier layer in the trench, forming a support layer on the preliminary barrier layer, forming a first opening at the support layer, forming a gate electrode layer filling the trench through the first opening, and forming a bit line structure electrically connected to the active pattern. The preliminary barrier layer and the support layer include the same conductive material.

A semiconductor device according to some exemplary embodiments of the disclosure includes an active pattern, a trench penetrating the active pattern, a gate structure in the trench, and a bit line structure electrically connected to the active pattern. The gate structure includes a first electrode portion, and a second electrode portion on the first electrode portion. The first electrode portion includes a first inclined top surface and a second inclined top surface which contact the second electrode portion, The second electrode portion includes a first inclined bottom surface contacting the first inclined top surface, and a second inclined bottom surface contacting the second inclined top surface.

DETAILED DESCRIPTION OF EXEMPLARY EMBODIMENTS

Figure 1A:
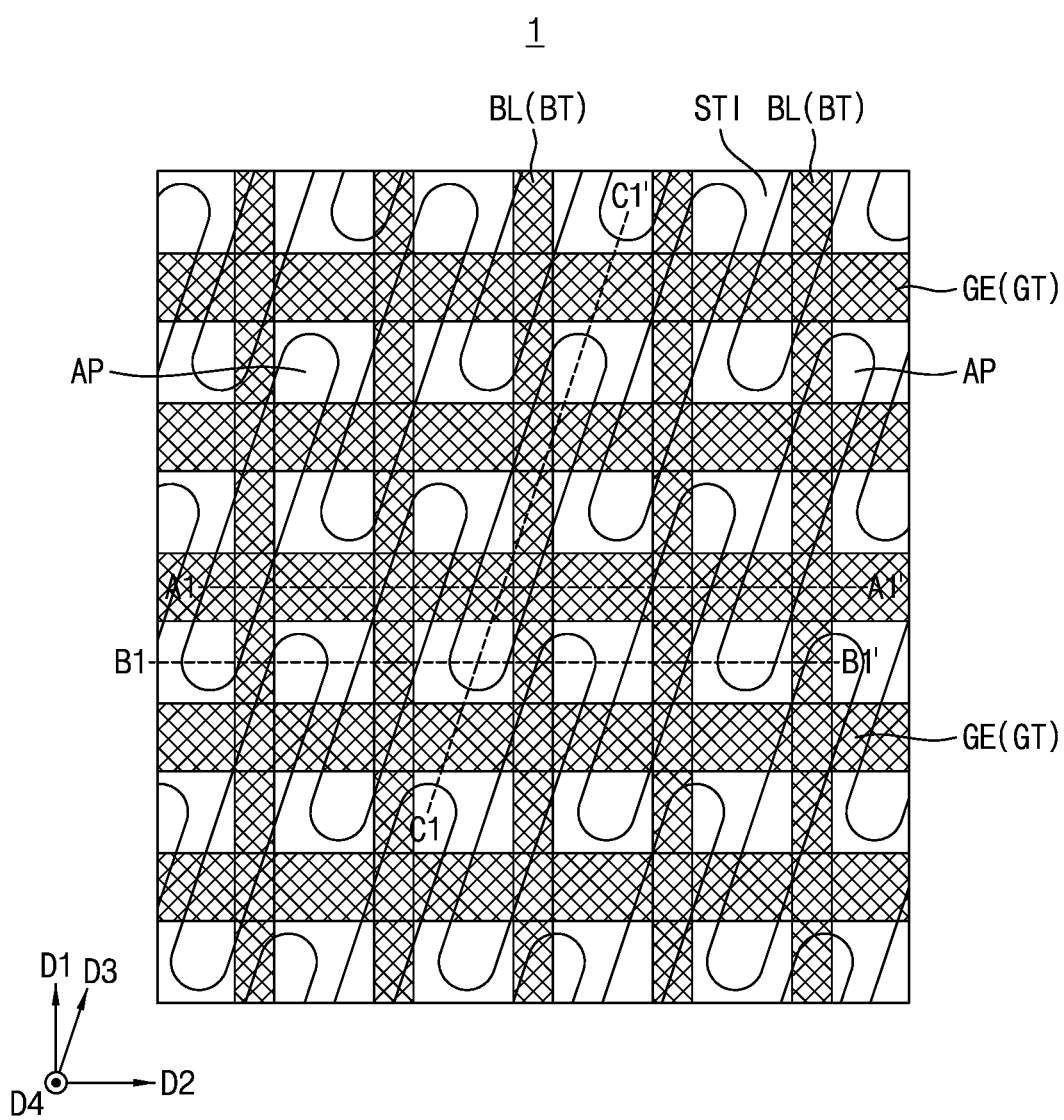
FIG. 1A is a plan view of a semiconductor device according to some embodiments of the present disclosure.
Figure 1B:
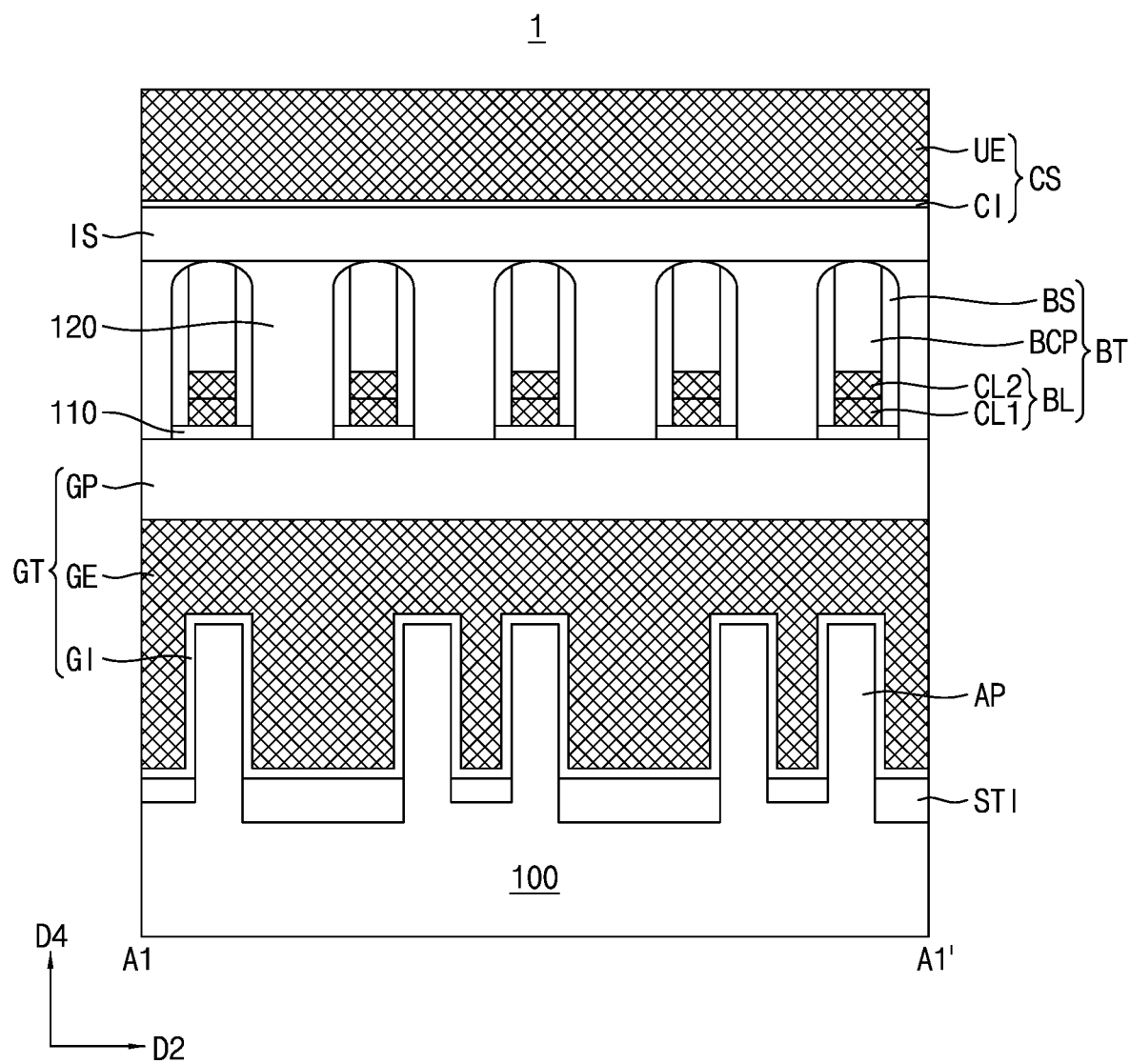
FIG. 1B is a cross-sectional view taken along A1-A1' of FIG. 1A.
Figure 1C:
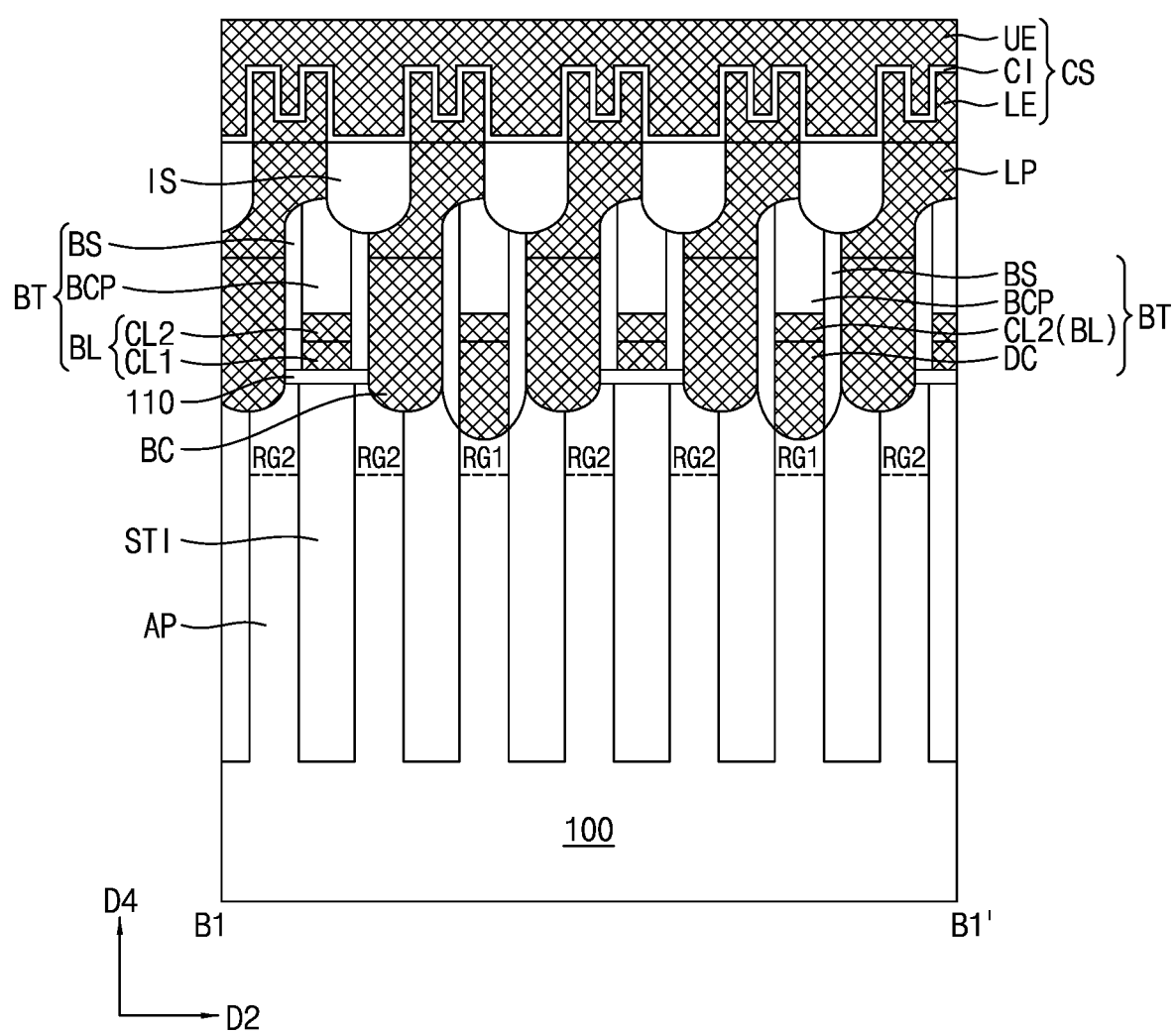
FIG. 1C is a cross-sectional view taken along B1-B1' of FIG. 1A.
Figure 1D:
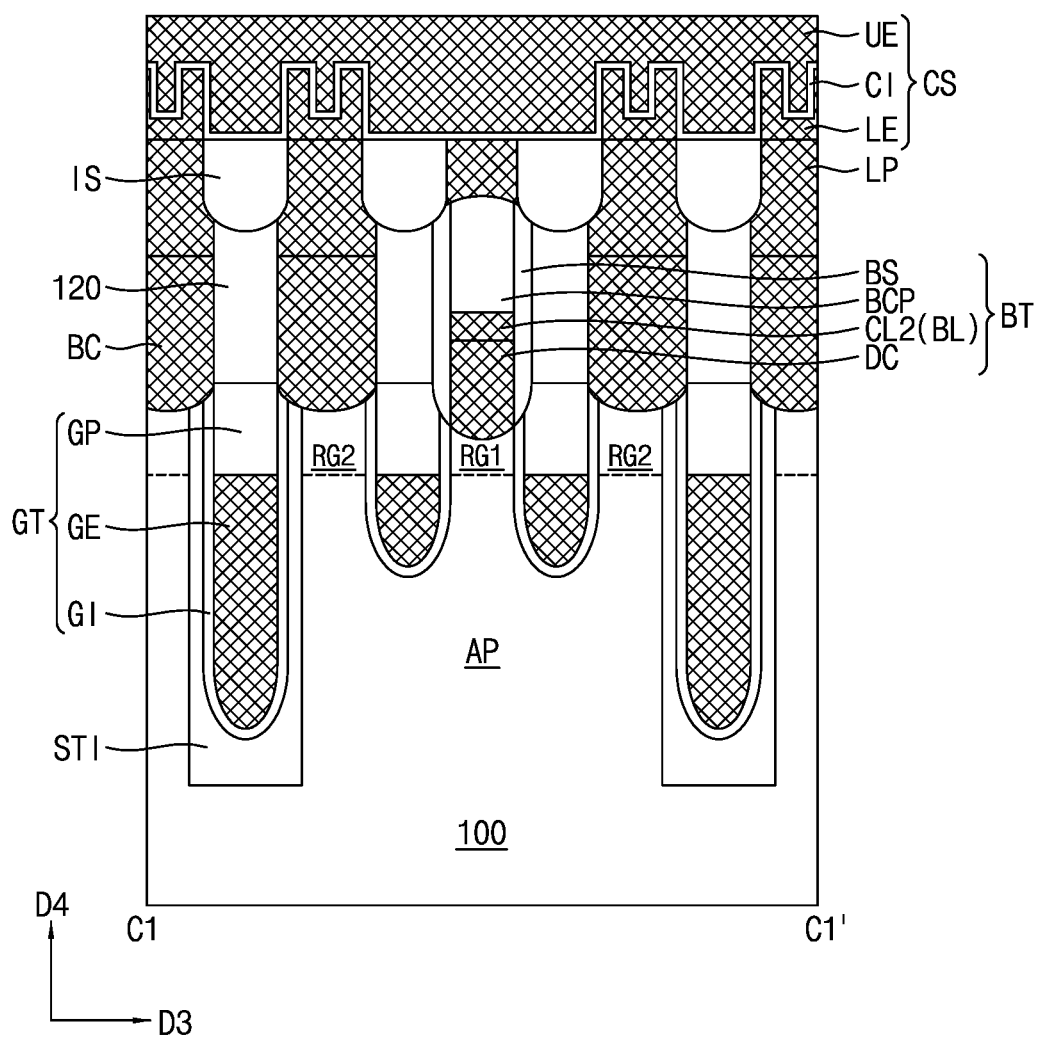
FIG. 1D is a cross-sectional view taken along C1-C1' of FIG. 1A.
Figure 2A:
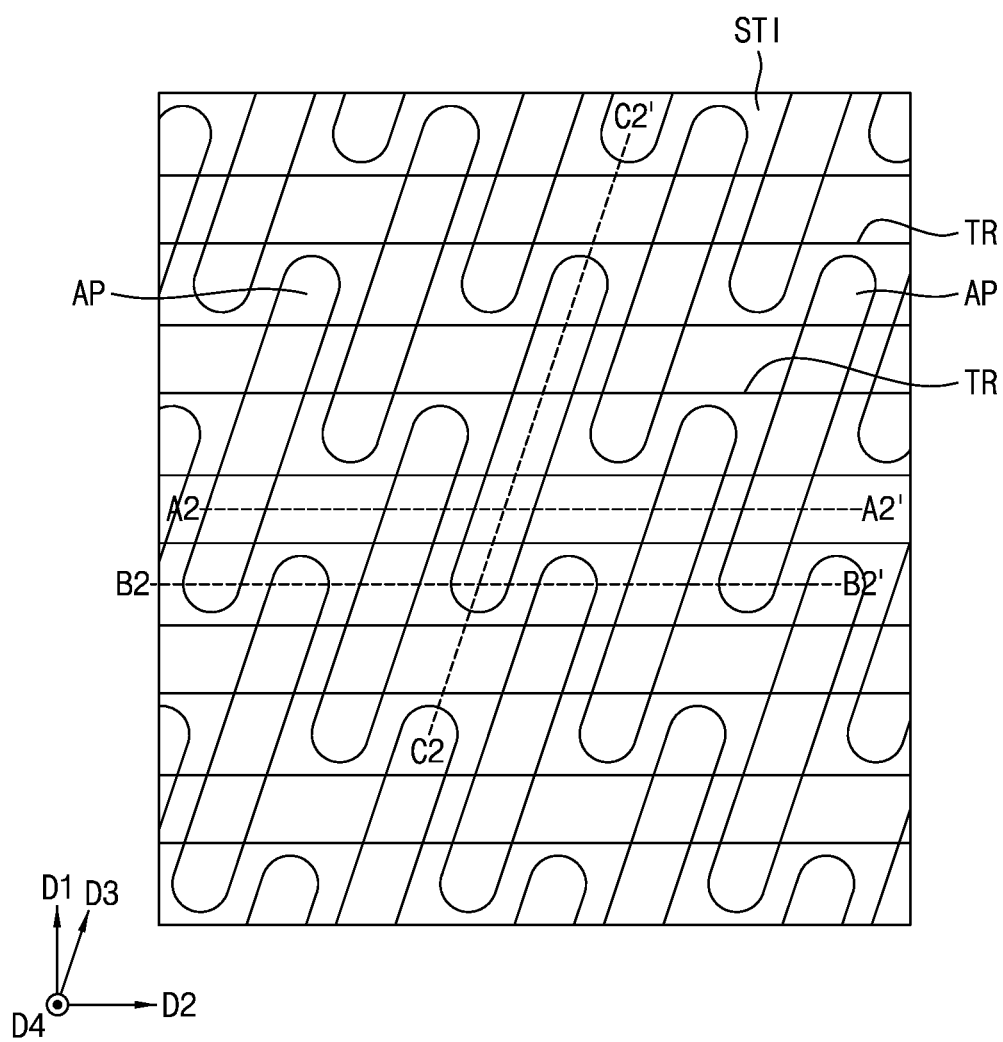
FIGS. 2A, 3A, 4A, 5A, 6A, 7A and 8A are plan views illustrating steps of a method of manufacturing a semiconductor device according to some embodiments of the present disclosure.
Figure 2B:
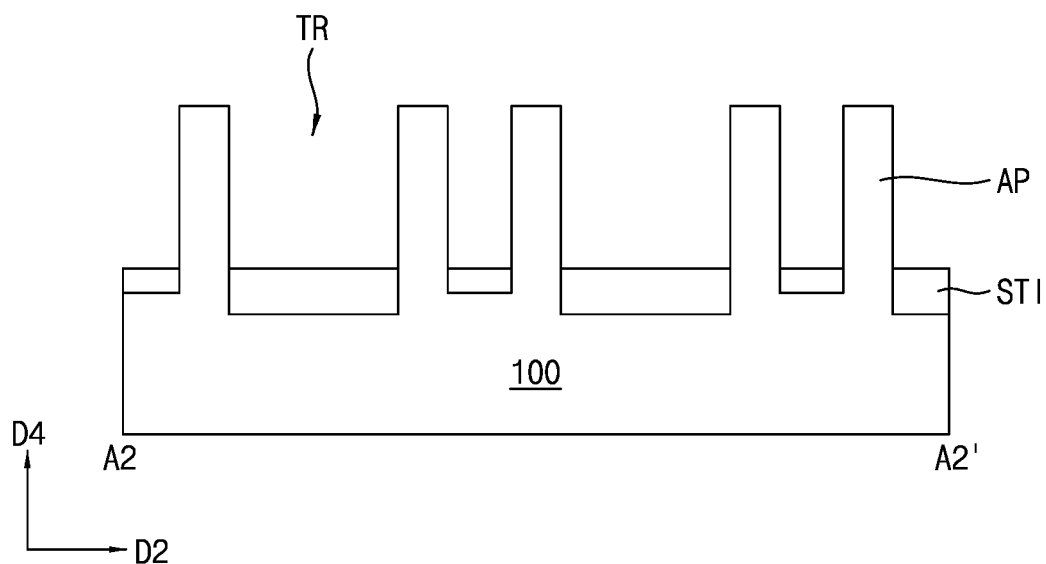
FIGS. 2B, 3B, 4B, 5B, 6B, 7B and 8B are cross-sectional views taken along A2-A2' of 2A, 3A, 4A, 5A, 6A, 7A and 8A respectively.
Figure 2C:
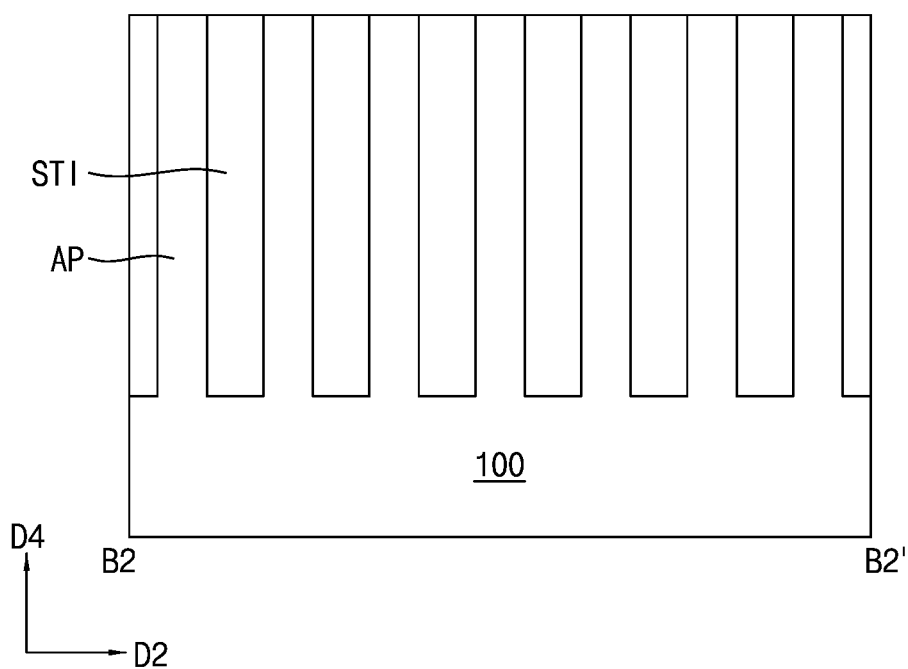
FIGS. 2C, 3C, 4C, 5C, 6C, 7C and 8C are cross-sectional views taken along B2-B2' of 2A, 3A, 4A, 5A, 6A, 7A and 8A respectively.
Figure 2D:
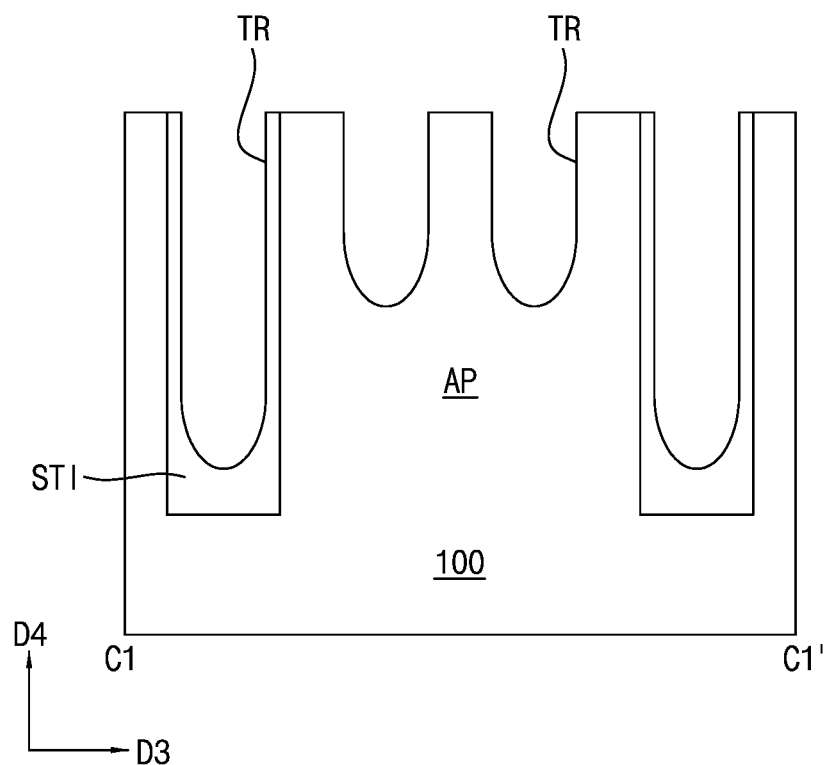
FIGS. 2D, 3D, 4D, 5D, 6D, 7D and 8D are cross-sectional views taken along C2-C2' of 2A, 3A, 4A, 5A, 6A, 7A and 8A respectively.

FIG. 1A is a plan view of a semiconductor device according to some exemplary embodiments of the disclosure. FIG. 1B is a cross-sectional view taken along line A1-A1' in FIG. 1A. FIG. 1C is a cross-sectional view taken along line B1-B1' in FIG. 1A. FIG. 1D is a cross-sectional view taken along line C1-C1' in FIG. 1A.

Referring to FIGS. 1A, 1B, 1C and 1D, a semiconductor device 1 may include a substrate 100. The substrate 100 may be a semiconductor substrate. For example, the substrate 100 may be a silicon substrate. The substrate 100 may have the form of a plate extending along a plane defined by and/or parallel to a first direction D1 and a second direction D2. The first direction D1 and the second direction D2 may intersect each other. For example, the first direction D1 and the second direction D2 may perpendicularly intersect each other.

The substrate 100 may include active patterns AP. The active patterns AP may extend in a third direction D3. The third direction D3 may intersect the first direction D1 and the second direction D2. For example, the third direction D3 may be parallel to a plane defined by and/or parallel to the first direction D1 and the second direction D2. Upper portions of the substrate 100 protruding in a fourth direction D4 may be defined as the active patterns AP. The fourth direction D4 may intersect the first direction D1, the second direction D2 and the third direction D3. For example, the fourth direction D4 may perpendicularly intersect the first direction D1, the second direction D2 and the third direction D3. The active patterns AP may be spaced apart from one another.

An element isolation layer STI may be provided in a space provided between the active patterns AP. The active patterns AP may be defined by the element isolation layer STI. Each of the active patterns AP may be surrounded by the element isolation layer STI, e.g., in a plan view. The active patterns AP may be spaced apart from one another by the element isolation layer STI. The element isolation layer STI may include or be formed of an insulating material. For example, the element isolation layer STI may include or be formed of an oxide.

Gate structures GT extending in the second direction D2 may be provided. The gate structures GT may be spaced apart from one another in the first direction D1. The gate structure GT may be provided on the element isolation layer STI and the active patterns AP. One gate structure GT may contact a plurality of active patterns AP.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The gate structures GT may penetrate the active patterns AP in the second direction D2. In some embodiments, two gate structures GT may penetrate one active pattern AP. Of course, the number of gate structures GT penetrating one active pattern AP is not limited to the above-described condition.

In some embodiments, each of the active patterns AP may include a first impurity region RG1 between two gate structures GT penetrating the active pattern AP, and second impurity regions RG2 spaced apart from each other under the condition that the first impurity region RG1 is interposed therebetween. For example, each first impurity region RG1 may be disposed between a pair of second impurity regions RG2, e.g., in the second direction D2 and/or in the third direction D3. A gate structure GT may be provided between the first impurity region RG1 and the second impurity region RG2, e.g., in a plan view.

Each of the gate structures GT may include a gate insulating layer GI, a gate electrode GE, and a gate capping layer GP. The gate insulating layer GI may cover surfaces of the active patterns AP and the element isolation layer STI. The gate electrode GE and the gate capping layer GP may be provided inside the gate insulating layer GI. The gate electrode GE may be spaced apart from the active pattern AP by the gate insulating layer GI. The gate capping layer GP may cover a top surface of the gate electrode GE. The gate insulating layer GI may include or be formed of an insulating material. For example, the gate insulating layer GI may include or be formed of an oxide. The gate electrode GE may include or be formed of a conductive material. For example, the gate electrode GE may include or be formed of tungsten, ruthenium, titanium nitride, or molybdenum. The gate capping layer GP may include or be formed of an insulating material. For example, the gate capping layer GP may include or be formed of an oxide.

An interlayer insulating layer 110 may be provided on the gate capping layer GP, the element isolation layer STI and the active pattern AP. The interlayer insulating layer 110 may include or be formed of an insulating material. For example, the interlayer insulating layer 110 may include or be formed of an oxide. In some embodiments, the interlayer insulating layer 110 may be a multilayer insulating layer.

Bit line structures BT extending in the first direction D1 may be provided. The bit line structures BT may be spaced apart from one another in the second direction D2. The bit line structure BT may be provided on the interlayer insulating layer 110, the active patterns AP and the element isolation layer STI. One bit line structure BT may be electrically connected to a plurality of active patterns AP. One bit line structure BT may contact a plurality of active patterns AP.

As used herein, components described as being "electrically connected" are configured such that an electrical signal can be transferred from one component to the other (although such electrical signal may be attenuated in strength as it transferred and may be selectively transferred).

Each of the bit line structures BT may include a bit line BL, direct contacts DC, bit line spacers BS, and a bit line capping layer BCP. The direct contacts DC may be provided on the first impurity regions RG1 of the active patterns AP, respectively. The direct contact DC may include or be formed of a conductive material.

The bit line BL may be provided on the direct contacts DC and the interlayer insulating layer 110. The bit line BL may contact a plurality of direct contacts DC. The bit line BL may be electrically connected to the first impurity regions RG1 of the active patterns AP via the direct contacts DC.

The bit line BL may include first conductive layers CL1 and a second conductive layer CL2. Each of the first conductive layers CL1 may extend in the first direction D1. The direct contact DC may be provided between the first conductive layers CL1 adjacent to each other in the first direction D1. For example, the first conductive layers CL1 may be provided at opposite sides of the direct contact DC. In some embodiments, the direct contacts DC and the first conductive layers CL1 may be coupled without forming boundaries and, as such, may configure an integrated structure. For example, the direct contacts DC and the first conductive layers CL1 may be formed at the same time and by the same manufacturing steps including deposition of a layer and pattering the layer. The second conductive layer CL2 may be provided on the first conductive layers CL1 and the direct contacts DC. The second conductive layer CL2 may extend in the first direction D1. The second conductive layer CL2 may contact a plurality of first conductive layer CL1 and a plurality of direct contacts DC. Each of the first conductive layer CL1 and the second conductive layer CL2 may include or be formed of a conductive material.

Although the bit line BL is shown and described as including the first conductive layers CL1 and the second conductive layer CL2, the exemplary embodiments of the disclosure are not limited thereto. In some embodiments, the bit line BL may be a single conductive layer.

The bit line capping layer BCP may be provided on the bit line BL. The bit line capping layer BCP may extend in the first direction D1. The bit line capping layer BCP may cover a top surface of the second conductive layer CL2 of the bit line BL. The bit line capping layer BCP may include or be formed of an insulating material. For example, the bit line capping layer BCP may include or be formed of an oxide.

The direct contacts DC, the bit line BL and the bit line capping layer BCP may be provided between the bit line spacers BS of the bit line structure BT. The bit line spacers BS of the bit line structure BT may be spaced apart from each other in the second direction D2 under the condition that the direct contacts DC, the bit line BL and the bit line capping layer BCP are interposed therebetween. The bit line spacers BS of the bit line structure BT may cover opposite side walls of each of the direct contacts DC, the bit line BL and the bit line capping layer BCP. The bit line spacers BS may extend in the first direction D1. The bit line spacers BS may include or be formed of an insulating material. For example, the bit line spacers BS may include or be formed of an oxide. In some embodiments, the bit line spacer BS may be a multilayer insulating layer.

Buried contacts BC may be provided. The second impurity regions RG2 of the active pattern AP may contact the buried contacts BC, respectively. The buried contact BC may be provided between the bit line structures BT. For example, the bit line structures BT may be provided at opposite sides of the buried contact BC. The buried contact BC may include or be formed of a conductive material.

Fences 120 may be provided. The fences 120 may be provided on the gate capping layer GP of the gate structure GT. The fence 120 may be provided between the buried contacts BC. For example, the buried contacts BC may be provided at opposite sides of the fence 120. The fence 120 may be provided between the bit line structures BT. For example, the bit line structures BT may be provided at opposite sides of the fence 120. The fence 120 may include or be formed of an insulating material. For example, the fence 120 may include or be formed of an oxide. In some embodiments, the fence 120 may be a multilayer insulating layer.

An insulating structure IS may be provided. The insulating structure IS may be provided on the bit line structures BT and the fences 120. The insulating structure IS may include or be formed of an insulating material. For example, the insulating structure IS may include or be formed of an oxide. In some embodiments, the insulating structure IS may be a multilayer insulating layer.

Landing pads LP may be provided. The landing pads LP may contact the buried contacts BC, respectively. A lower portion of the landing pad LP may be provided between the bit line structures BT. The lower portion of the landing pad LP may be provided between the fences 120. An upper portion of the landing pad LP may be surrounded by the insulating structure IS. The landing pad LP may penetrate the insulating structure IS. A plurality of landing pads LP may be spaced apart from one another by the bit line structures BT, the fences 120 and the insulating structure IS. The landing pads LP may include or be formed of a conductive material.

A capacitor structure CS may be provided on the landing pads LP and the insulating structure IS. The capacitor structure CS may include lower electrodes LE, a capacitor insulating layer CI, and an upper electrode UE.

The lower electrodes LE may contact the landing pads LP, respectively. Each of the lower electrodes LE may be electrically connected to a second impurity region RG2 of an active pattern AP via a landing pad LP and a buried contact BC. A capacitor insulating layer CI may be provided between the lower electrodes LE and the upper electrode UE. The capacitor insulating layer CI may include or be formed of an insulating material. For example, the capacitor insulating layer CI may include or be formed of an oxide. The lower electrodes LE and the upper electrode UE may include or be formed of a conductive material.

Figure 3A:
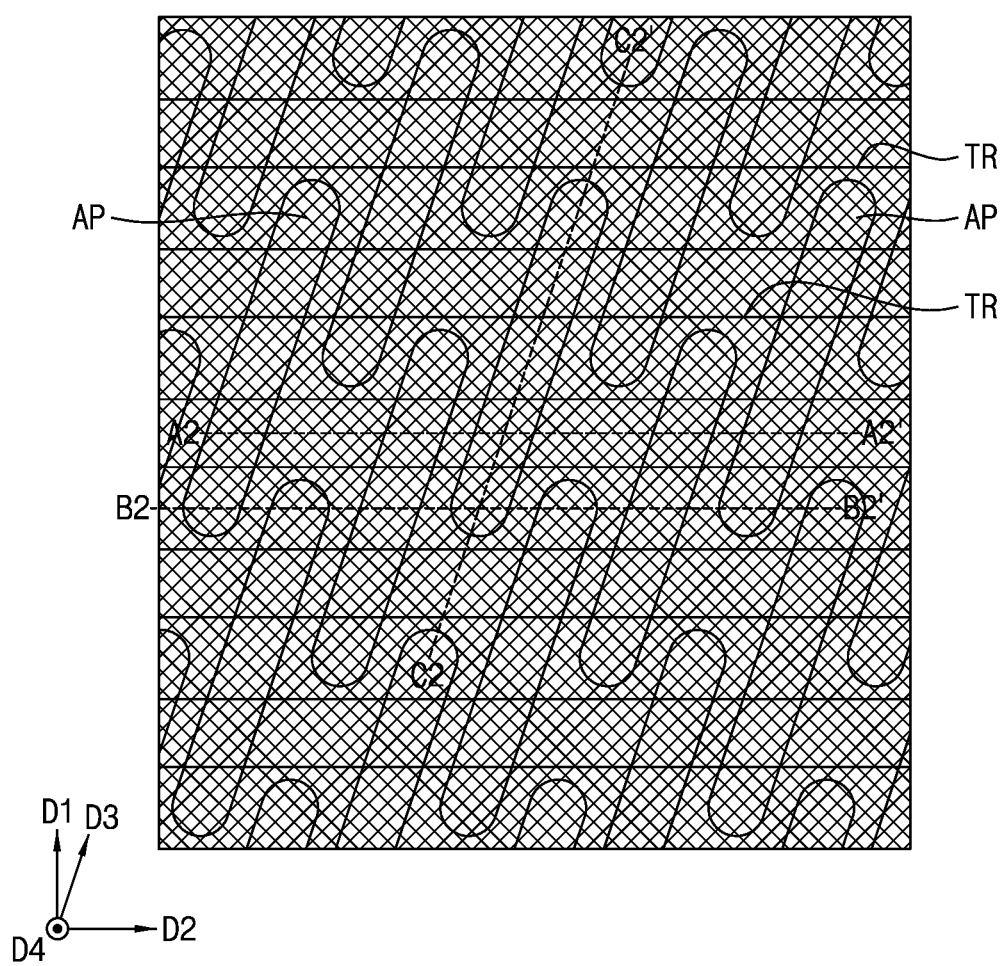
Figure 3B:
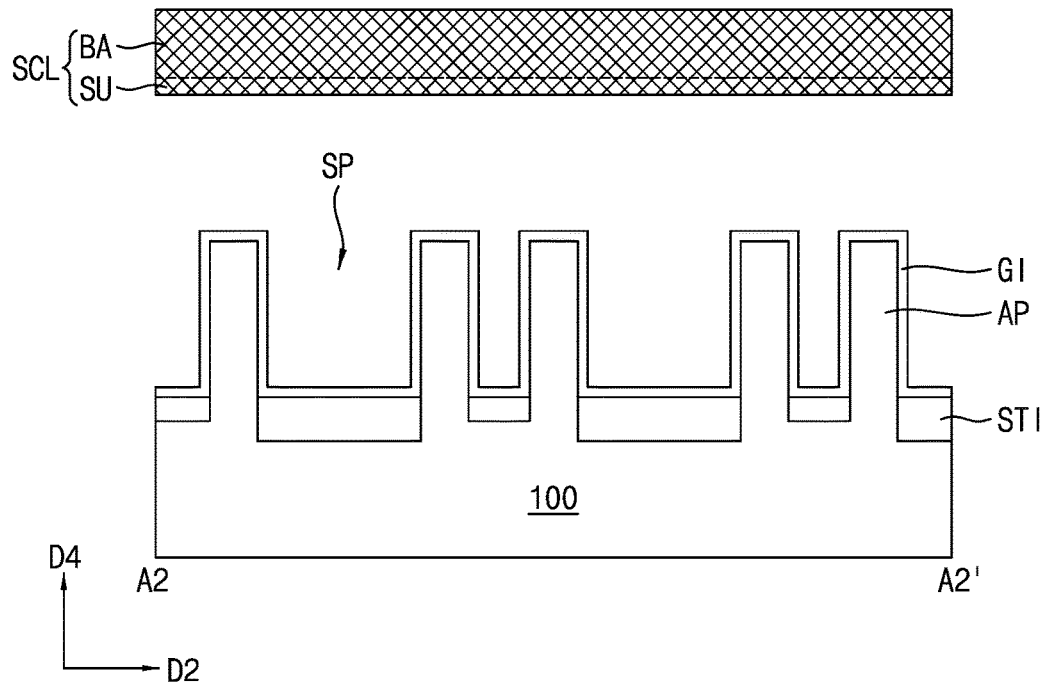
Figure 3C:
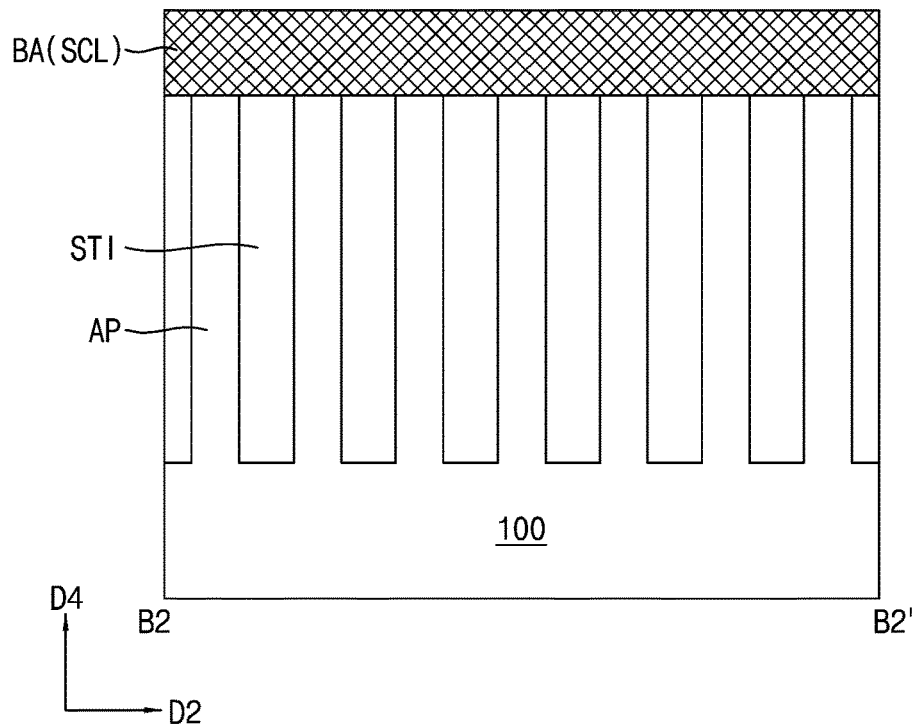
Figure 3D:
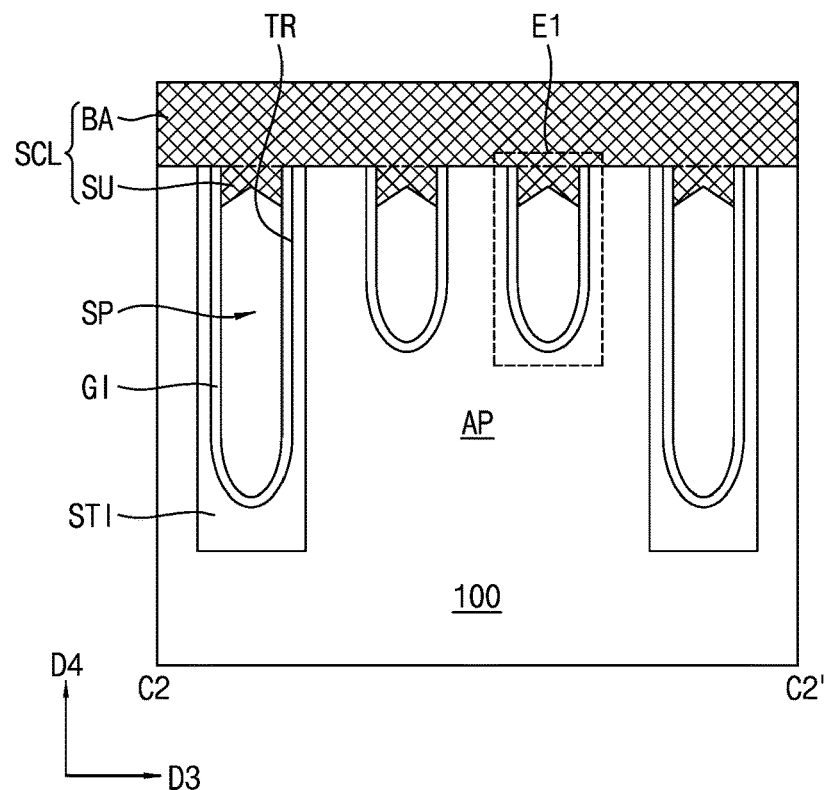
Figure 3E:
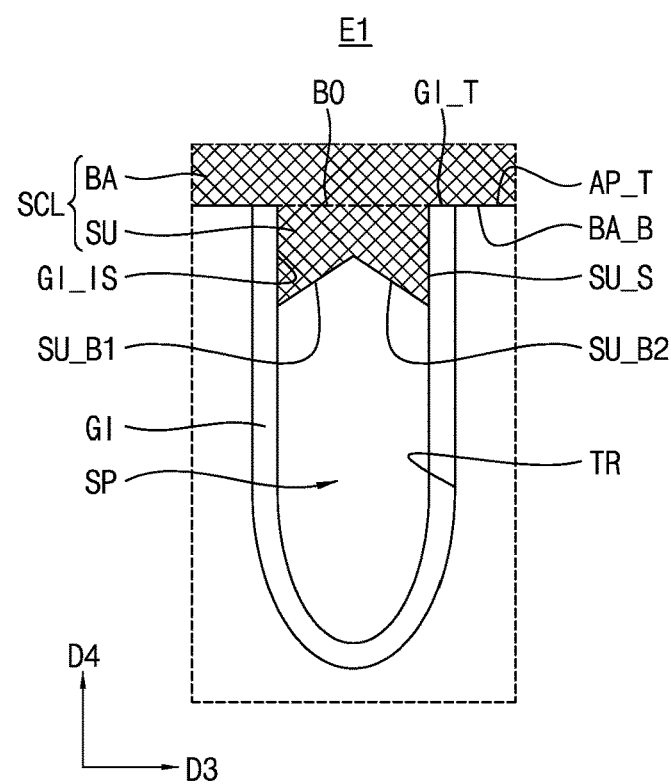
FIG. 3E is an enlarged view of area E1 of FIG. 3C.
Figure 4A:
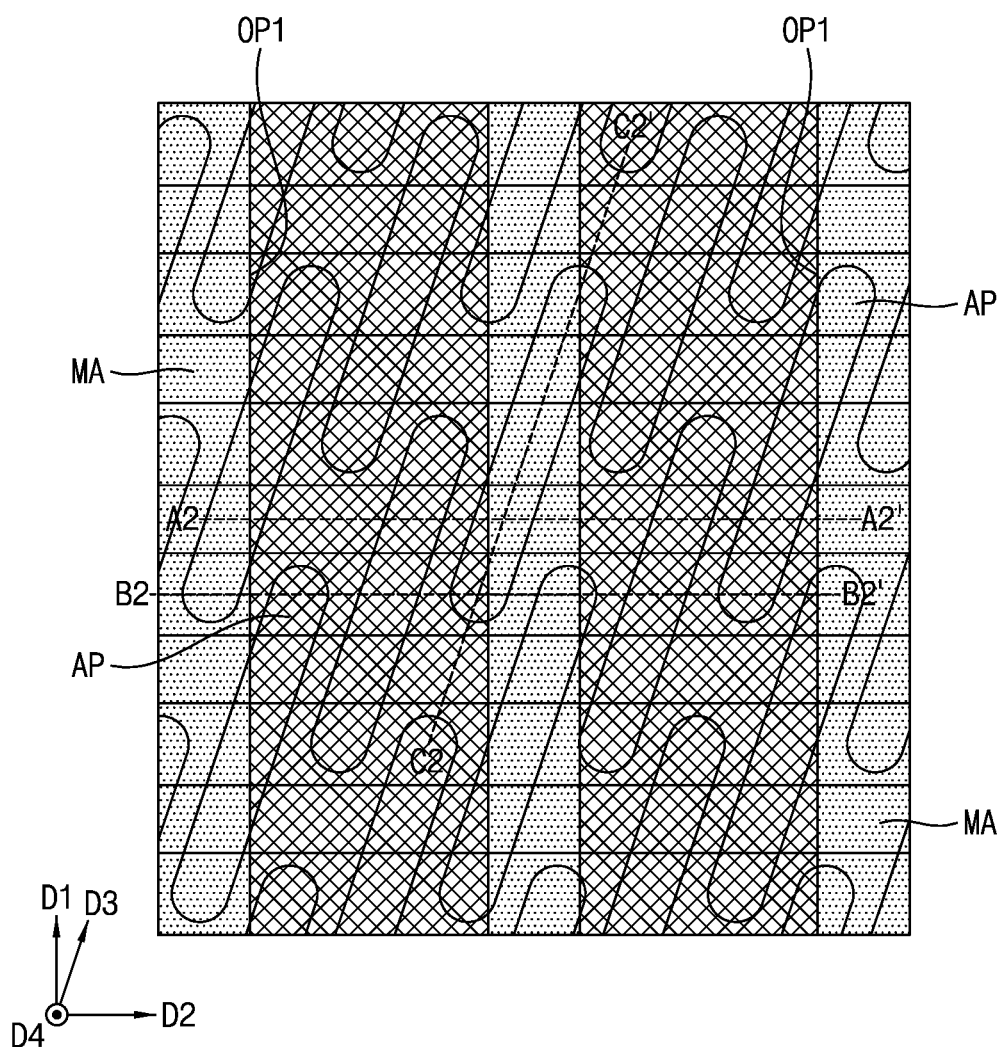
Figure 4B:
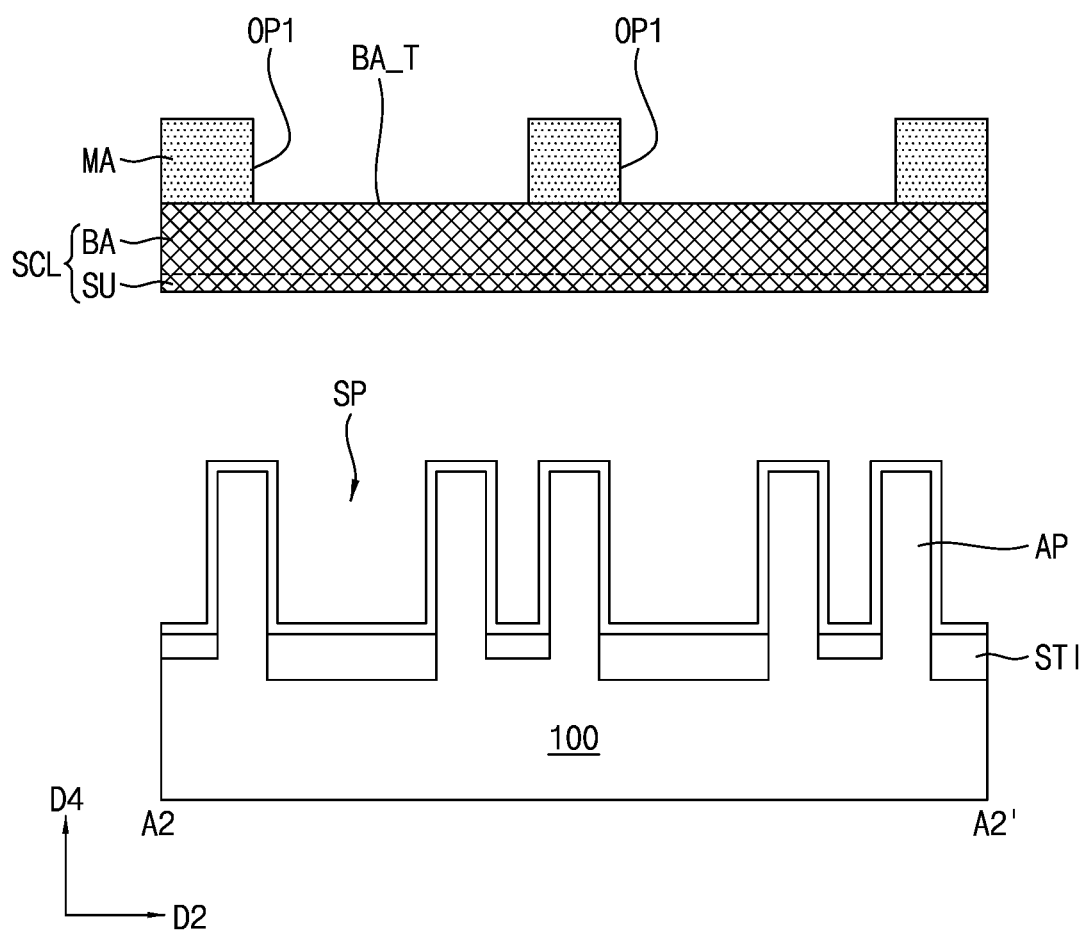
Figure 4C:
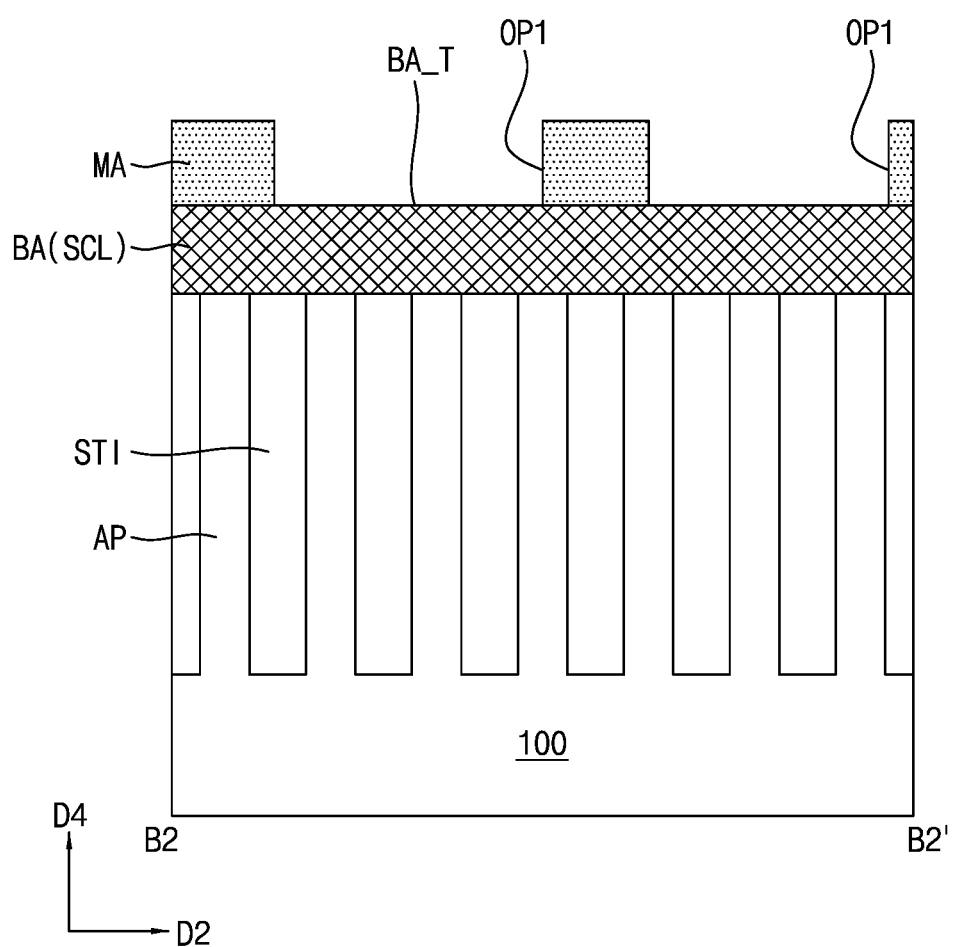
Figure 4D:
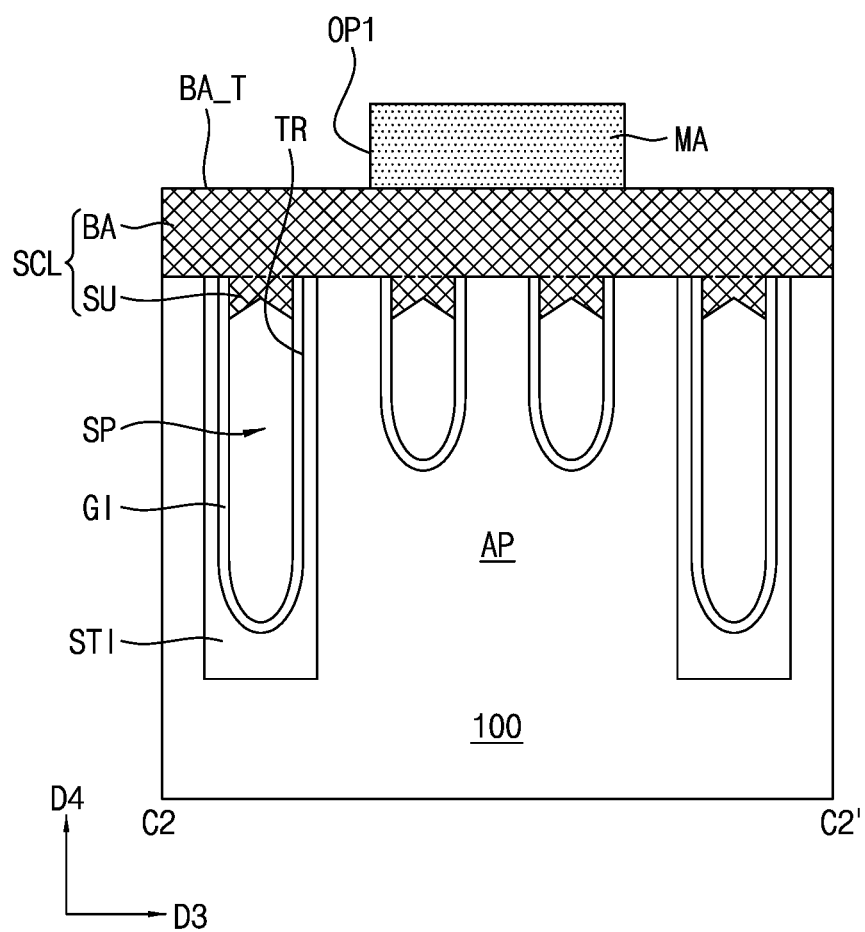
Figure 5A:
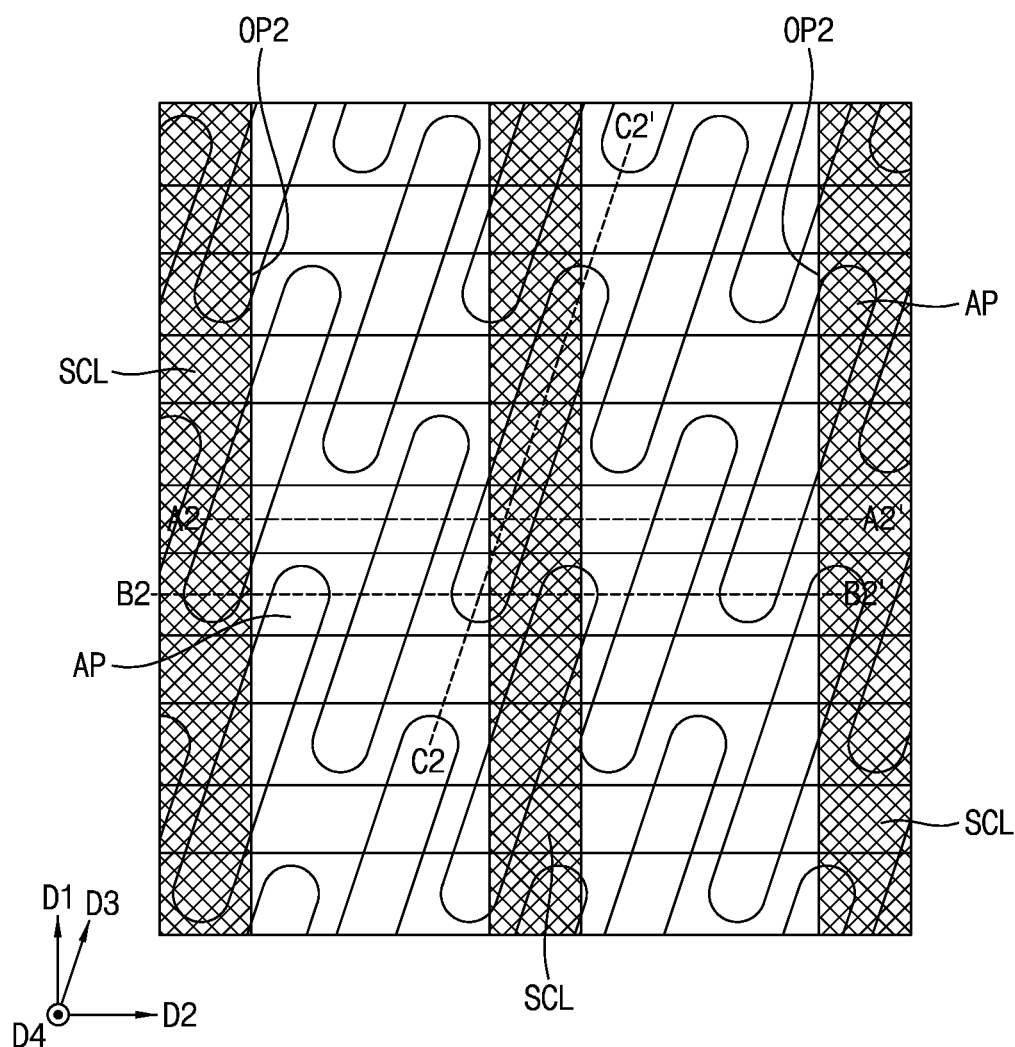
Figure 5B:
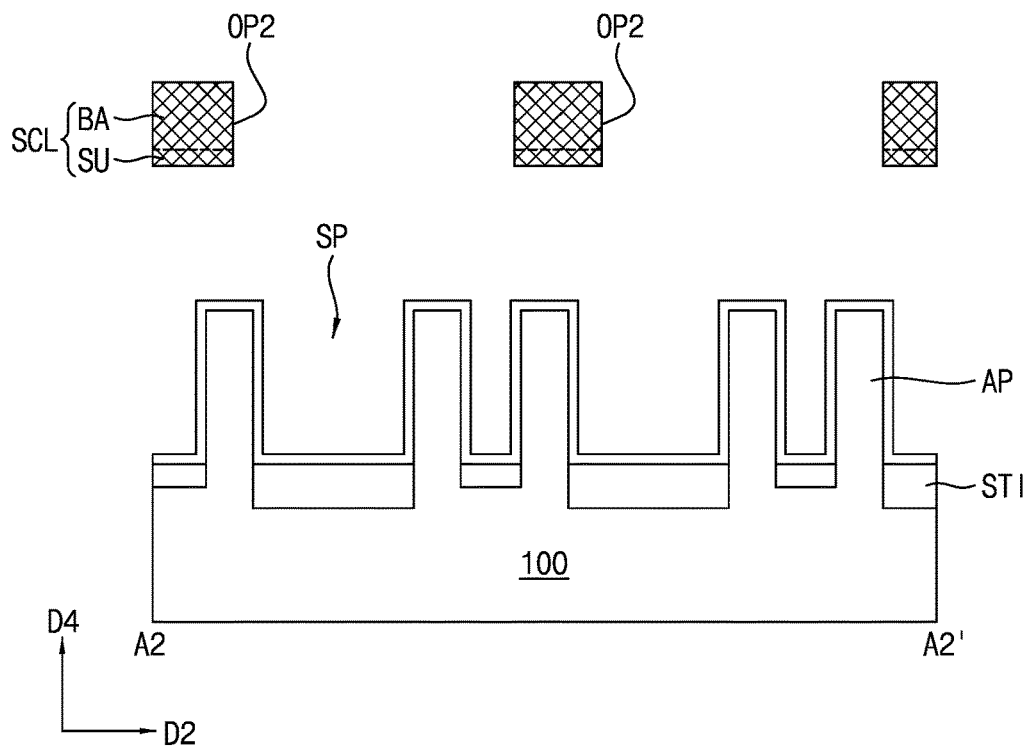
Figure 5C:
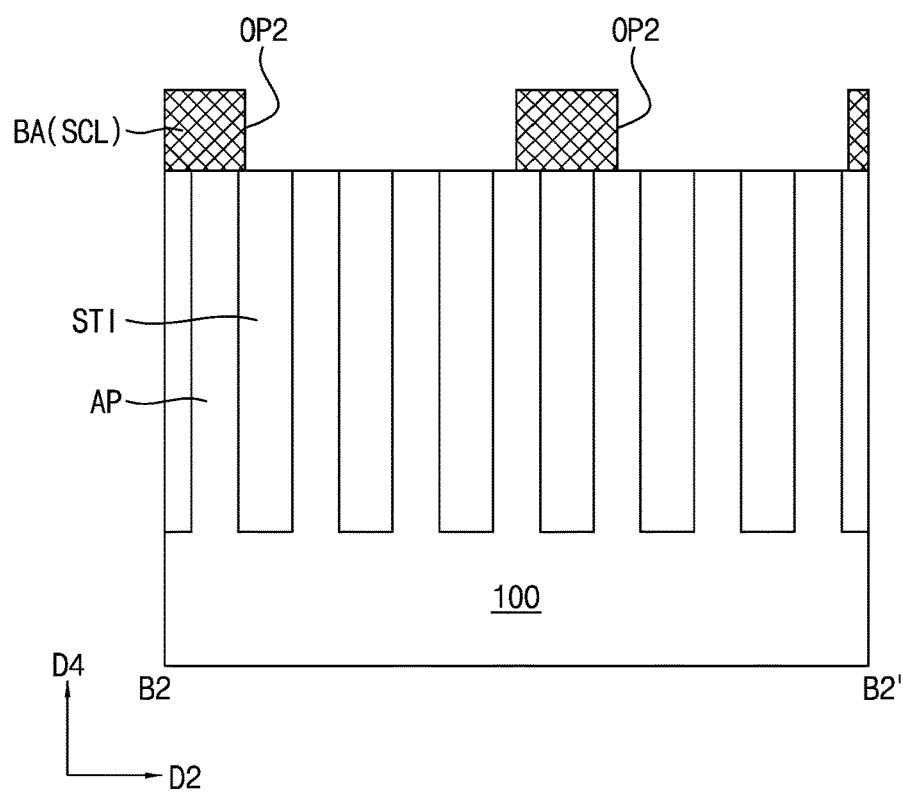
Figure 5D:
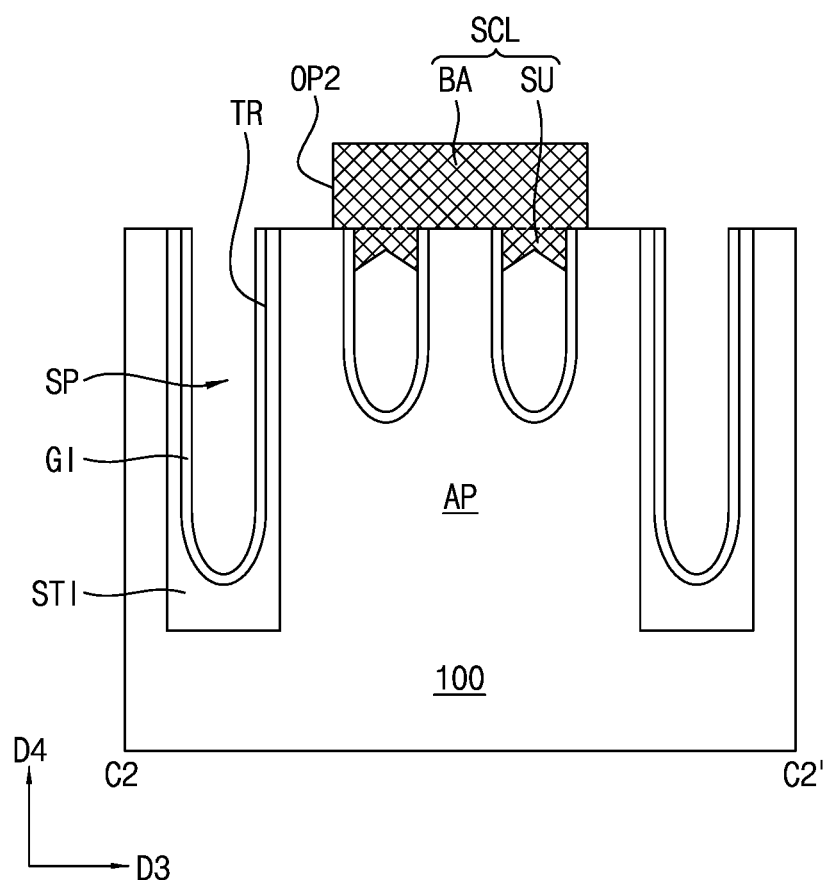
Figure 6A:
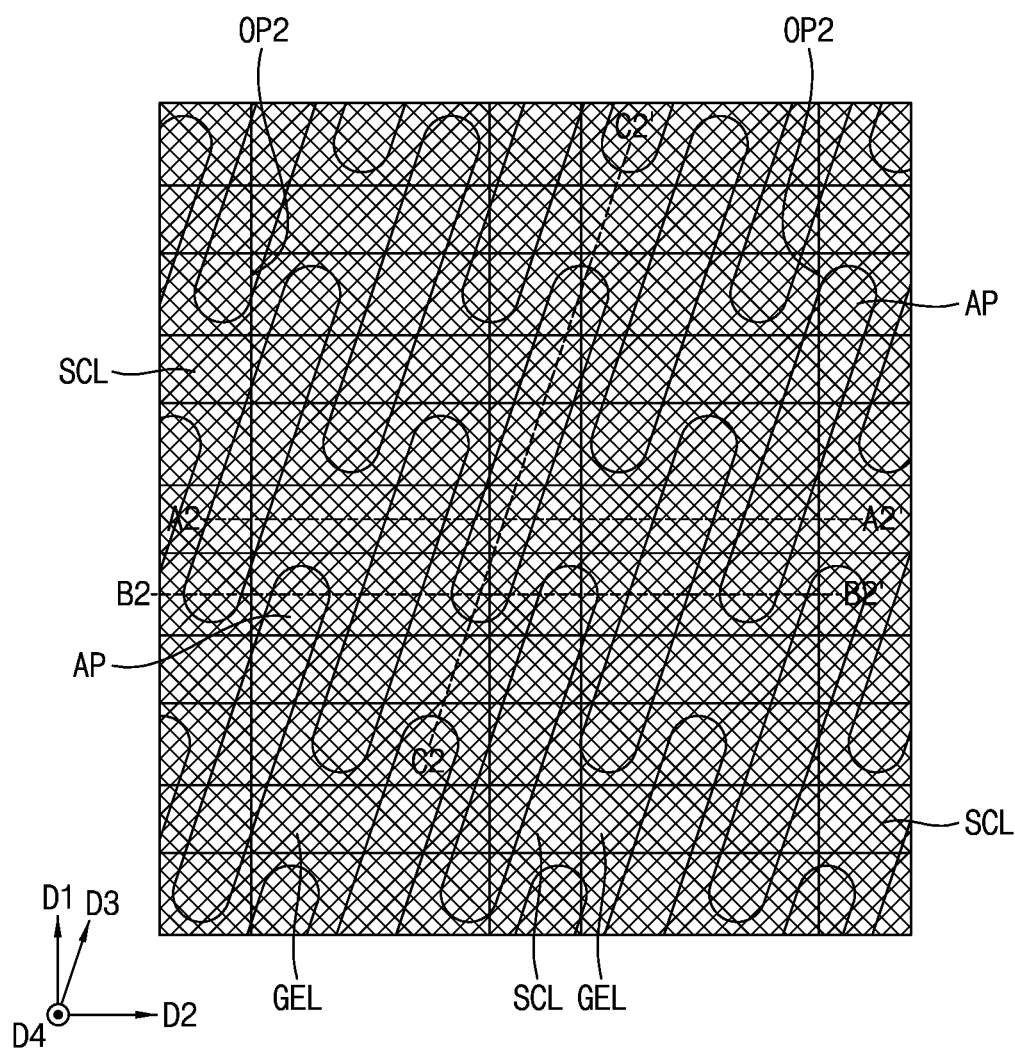
Figure 6B:
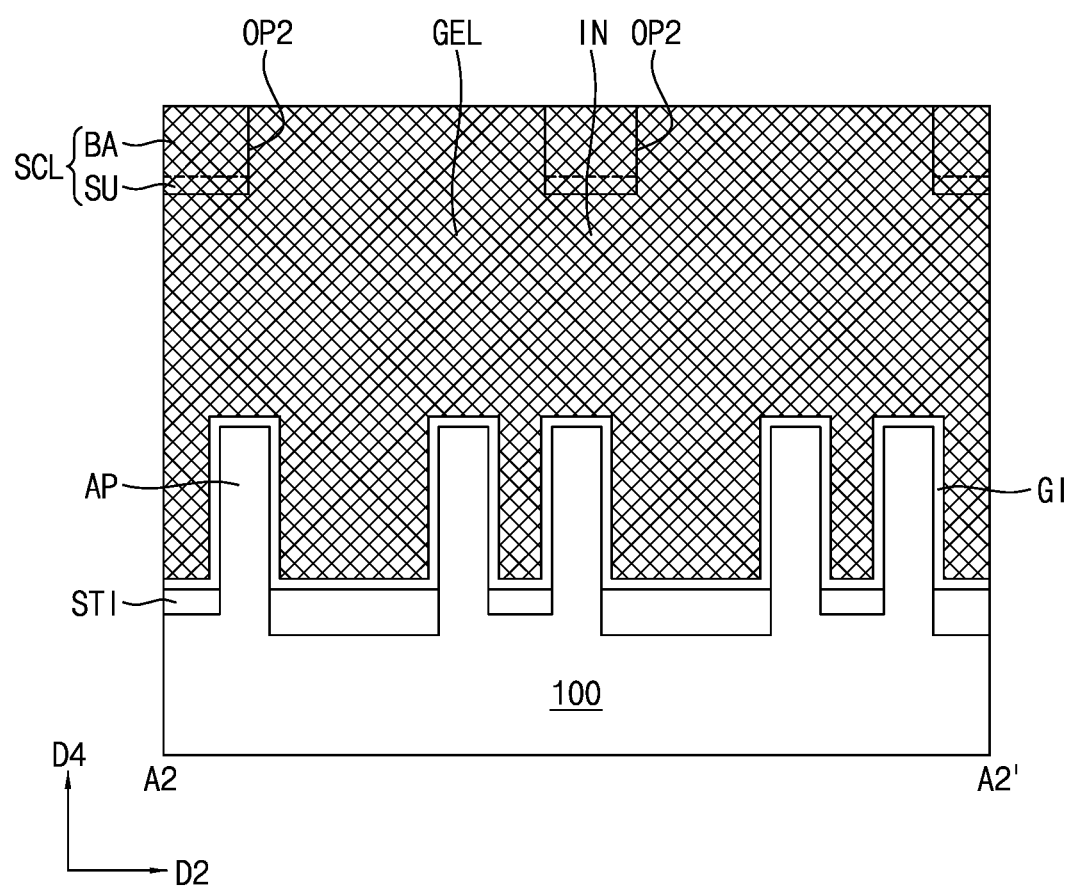
Figure 6C:
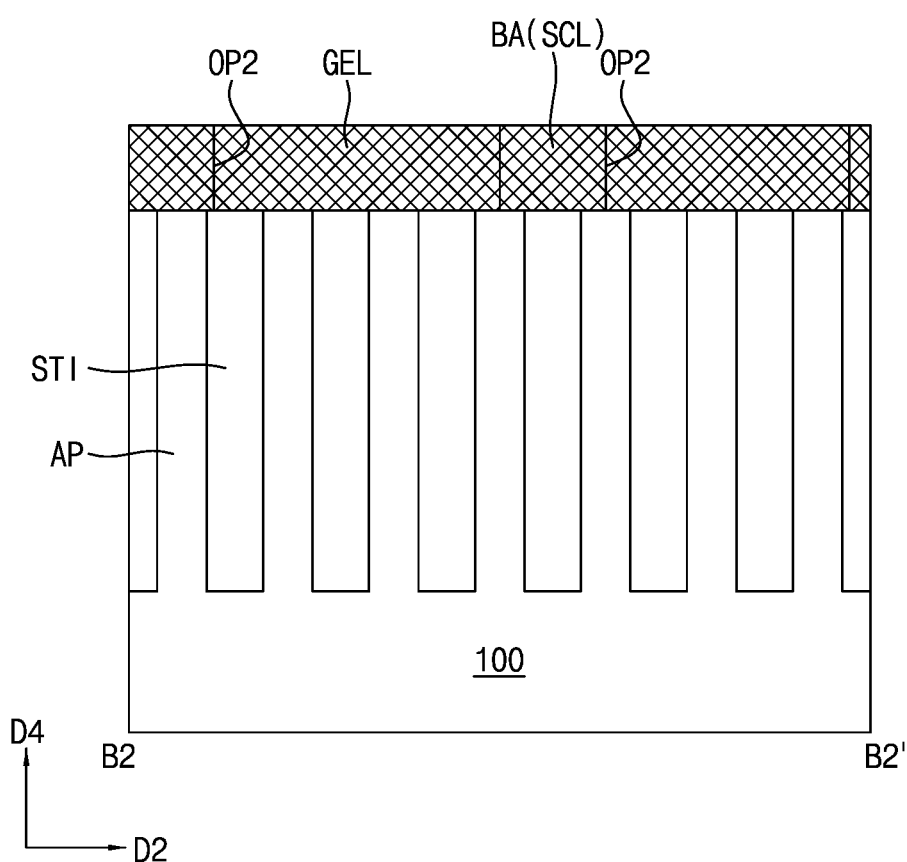
Figure 6D:
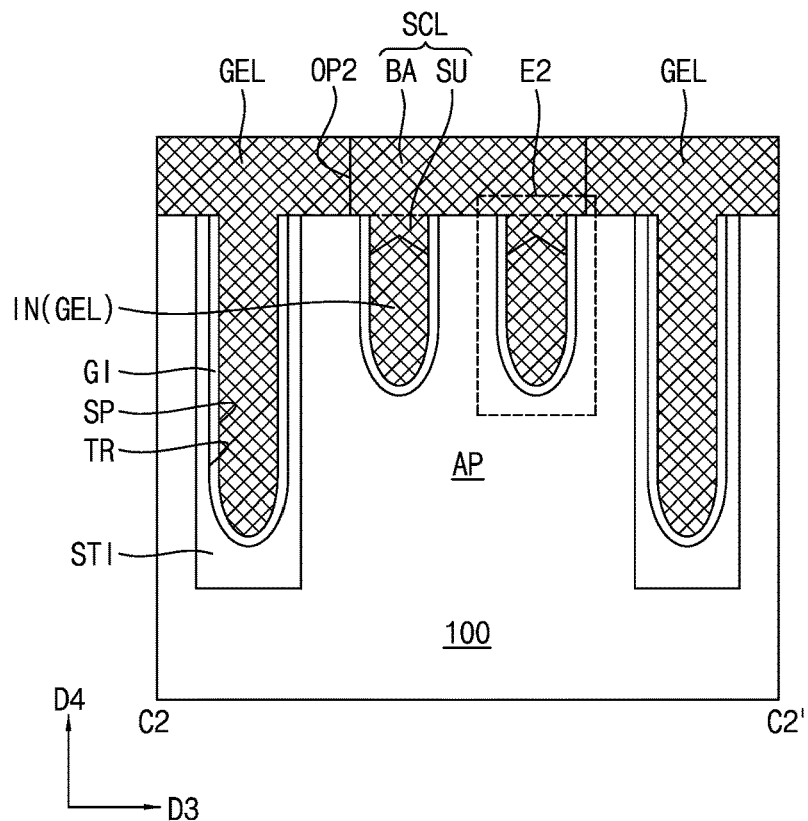
Figure 6E:
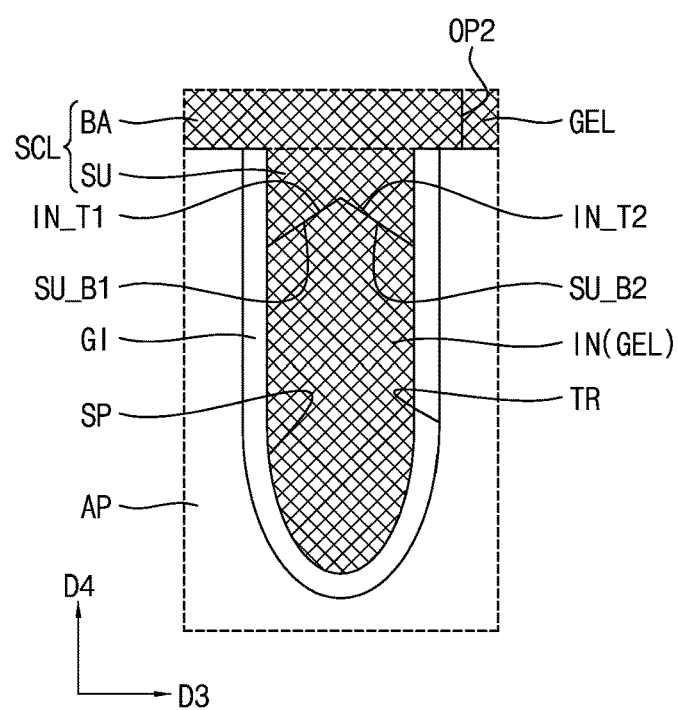
FIG. 6E is an enlarged view of area E2 of FIG. 6D.
Figure 7A:
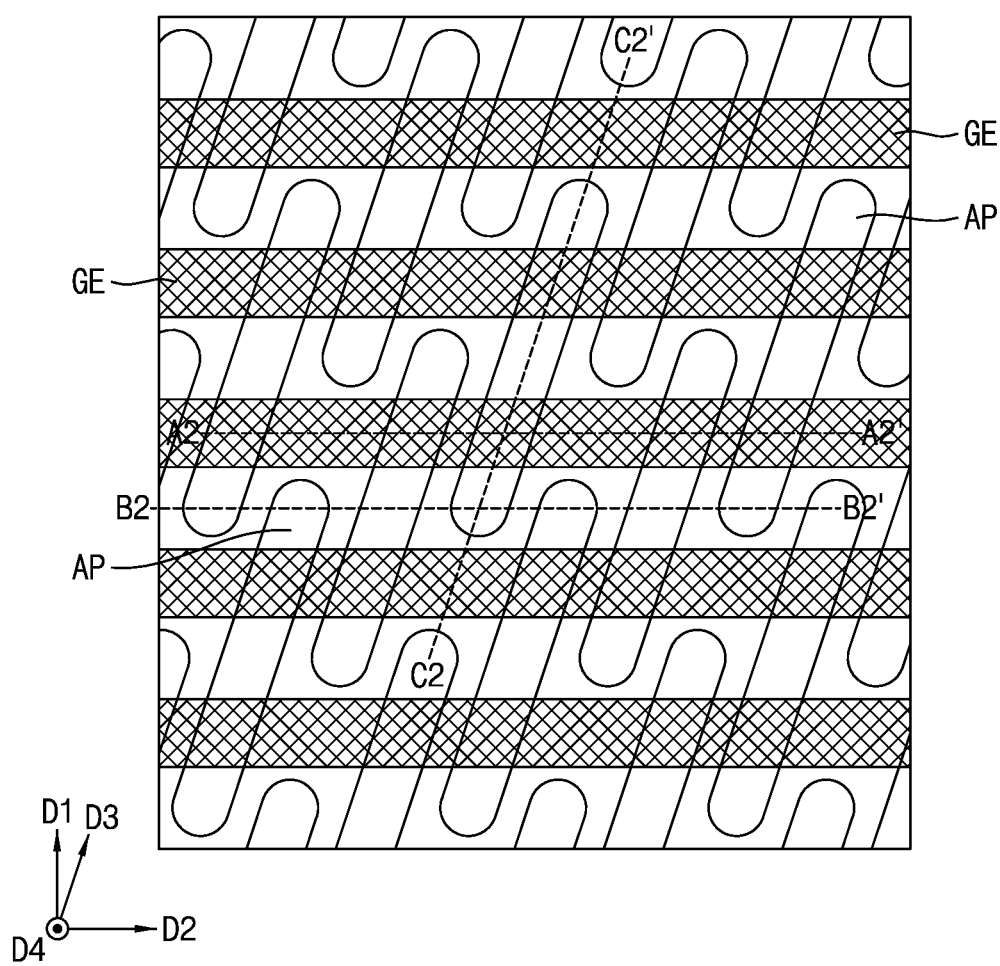
Figure 7B:
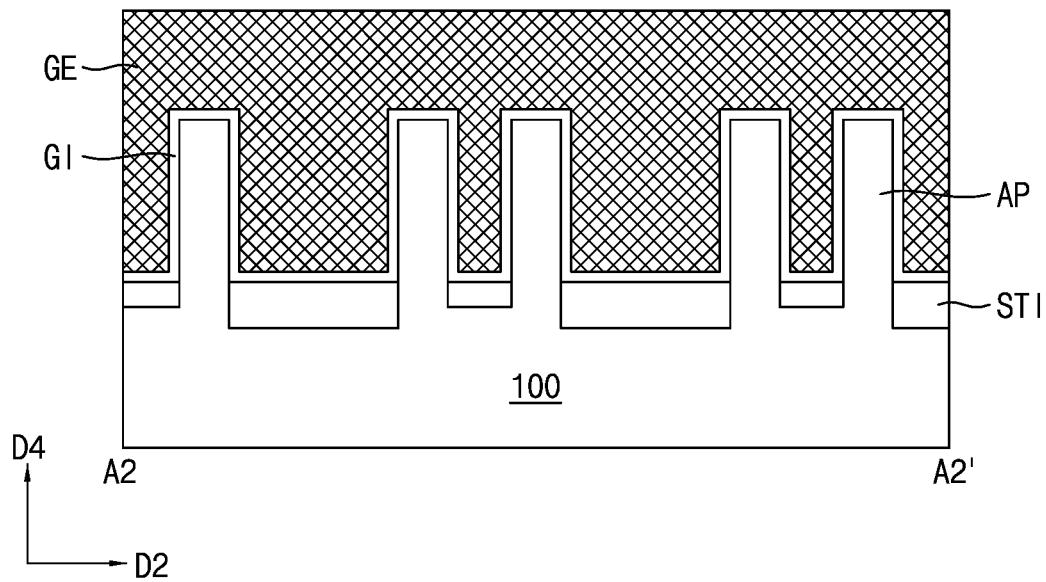
Figure 7C:
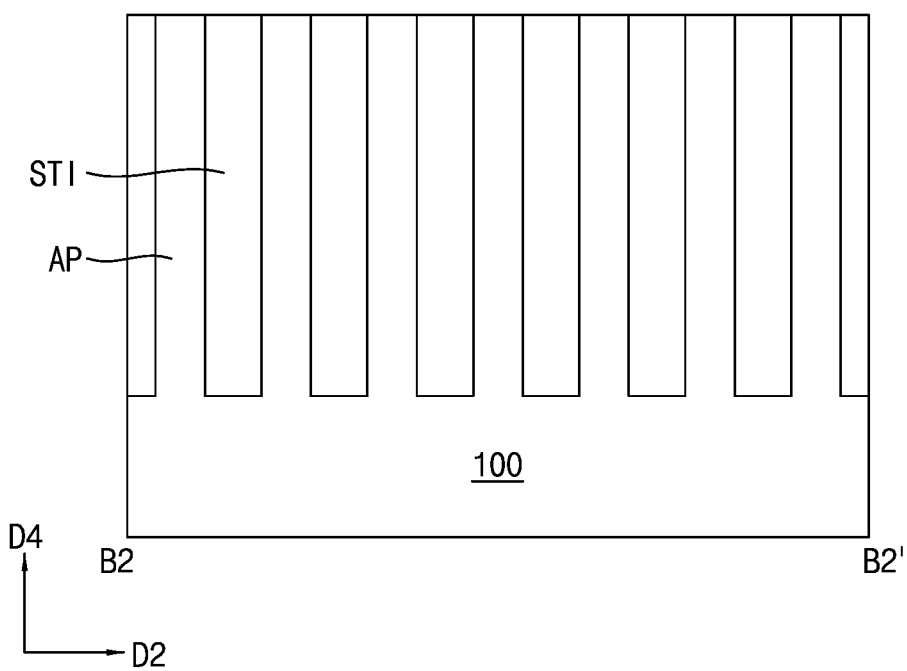
Figure 7D:
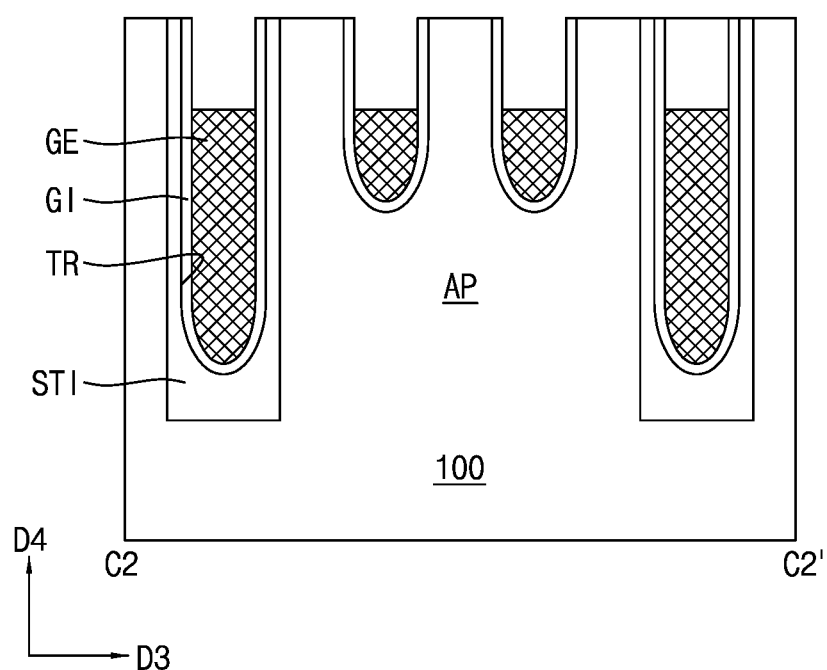
Figure 8A:
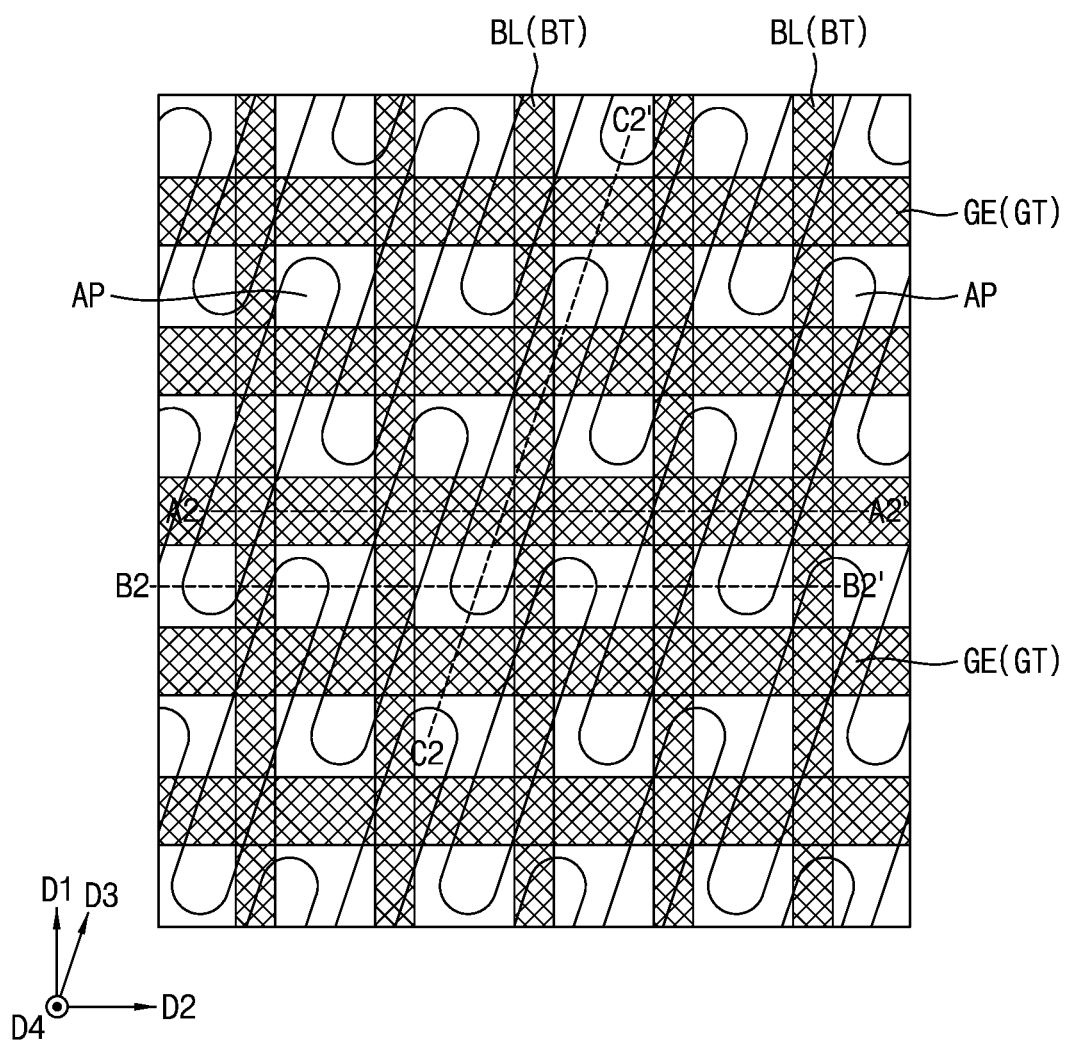
Figure 8B:
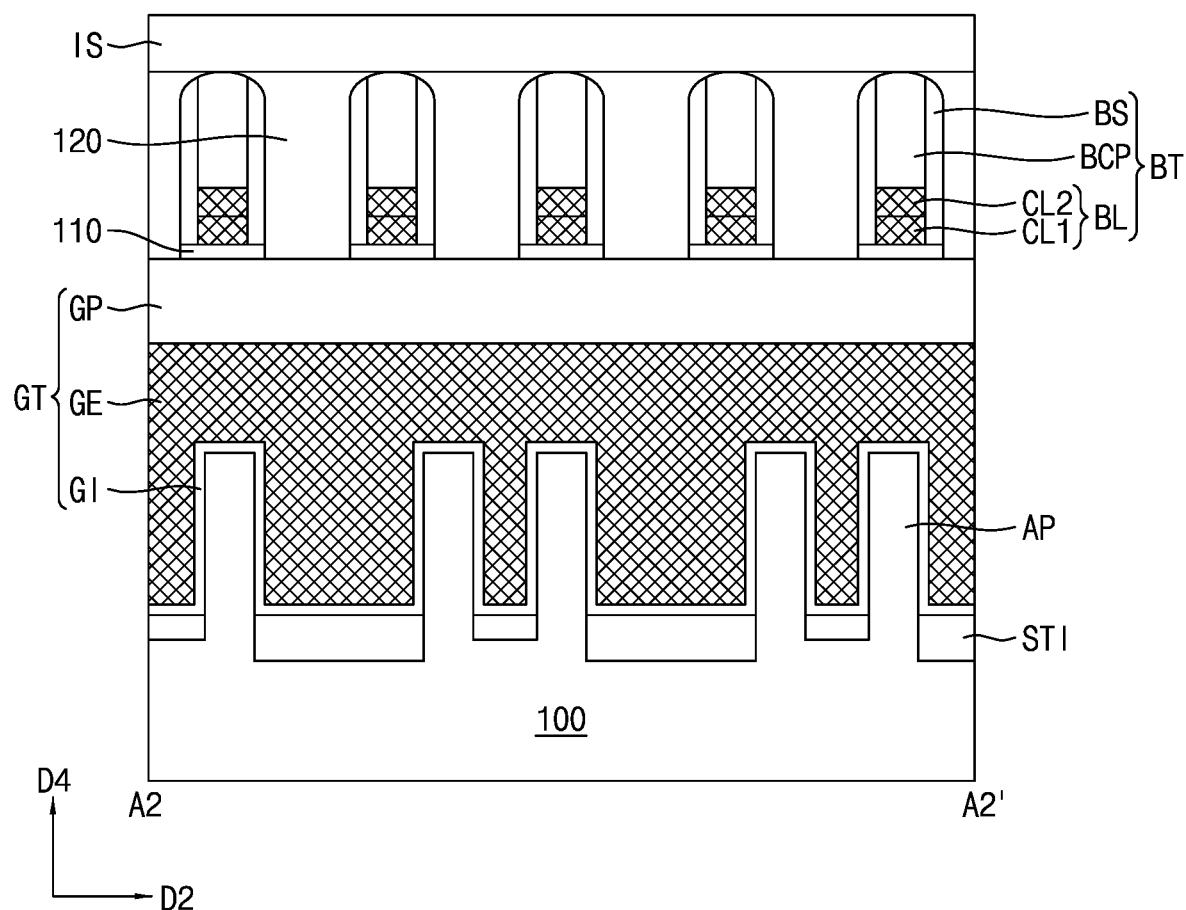
Figure 8C:
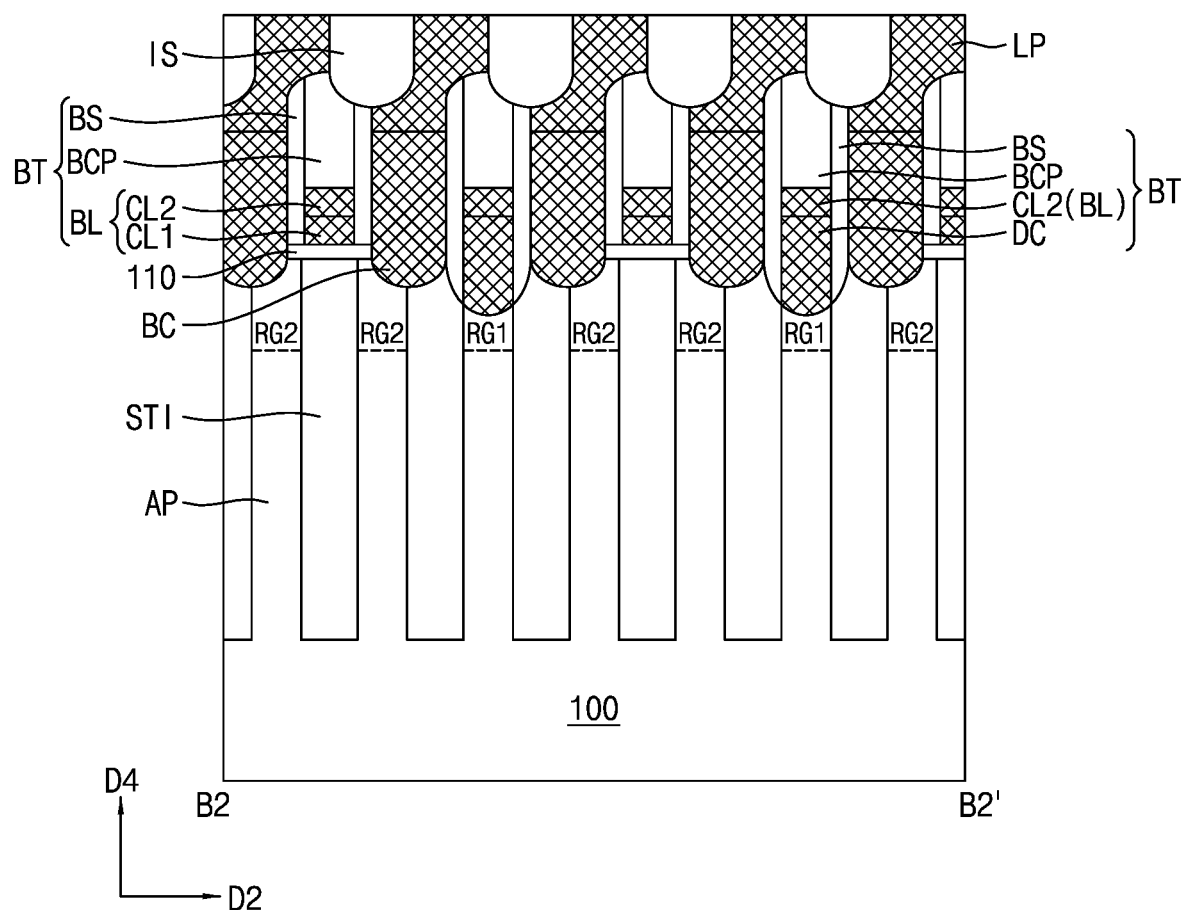
Figure 8D:
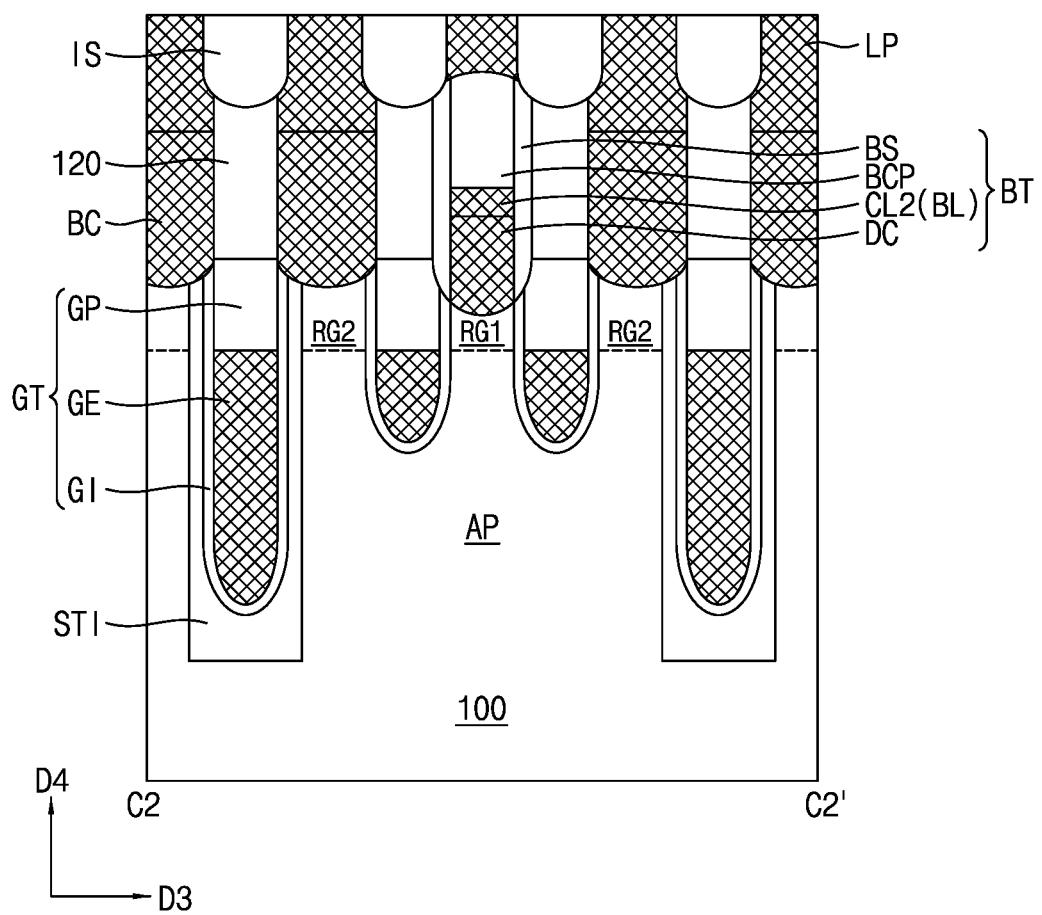

FIGS. 2A, 3A, 4A, 5A, 6A, 7A and 8A are plan views for explaining a semiconductor device manufacturing method according to some exemplary embodiments of the disclosure. FIGS. 2B, 3B, 4B, 5B, 6B, 7B and 8B are cross-sectional views taken along lines A2-A2' in FIGS. 2A, 3A, 4A, 5A, 6A, 7A and 8A, respectively. FIGS. 2C, 3C, 4C, 5C, 6C, 7C and 8C are cross-sectional views taken along lines B2-B2' in FIGS. 2A, 3A, 4A, 5A, 6A, 7A and 8A, respectively. FIGS. 2D, 3D, 4D, 5D, 6D, 7D and 8D are cross-sectional views taken along lines C2-C2' in FIGS. 2A, 3A, 4A, 5A, 6A, 7A and 8A, respectively. FIG. 3E is an enlarged view of a portion E1 of FIG. 3D. FIG. 6E is an enlarged view of a portion E2 of FIG. 6D.

Referring to FIGS. 2A, 2B, 2C and 2D, a substrate 100 may be patterned, thereby forming active patterns AP. An element isolation layer STI may be formed in a space provided between the active patterns AP.

Thereafter, trenches TR penetrating the active patterns AP may be formed. The trenches TR may extend in a second direction D2. The trenches TR may be formed by etching the active patterns AP and the element isolation layer STI. The trench TR may be defined by surfaces of the active patterns AP and a surface of the element isolation layer STI.

Referring to FIGS. 3A, 3B, 3C, 3D and 3E, gate insulating layers GI may be formed in the trenches TR, respectively. The gate insulating layer GI may be conformally formed on the surfaces of the active patterns AP and the element isolation layer STI defining the trench TR. Formation of the gate insulating layers GI may include conformally forming a preliminary gate insulating layer on the surfaces of the active patterns AP and the element isolation layer STI, and removing an upper portion of the preliminary gate insulating layer, thereby dividing the preliminary gate insulating layer into a plurality of gate insulating layers GI.

Thereafter, a support layer SCL may be formed on the active patterns AP, the gate insulating layers GI, and the element isolation layer STI. The support layer SCL may cover the trench TR. The support layer SCL may close the trench TR. For example, an upper portion of the trench TR may be blocked by the support layer SCL. As the support layer SCL is formed to close the trench TR, a closed empty space SP may be formed in the trench TR. The closed empty space SP may be surrounded by the gate insulating layer GI and the support layer SCL. The closed empty space SP may be defined by surfaces of the gate insulating layer GI and the support layer SCL. In some embodiments, the support layer SCL may include or be formed of a conductive material. For example, the support layer SCL may include or be formed of tungsten, titanium nitride, molybdenum, or ruthenium. For example, the closed empty space SP may be at a vacuum state or may be filled with gas/air.

In some embodiments, the support layer SCL may be formed using a formation process having relatively bad step coverage. For example, the support layer SCL may be formed using physical vapor deposition (PVD) or chemical vapor deposition (CVD).

Referring to FIG. 3E, the support layer SCL may include a base portion BA and a plurality of support portions SU. A portion of the support layer SCL covering a top surface AP_T of the active pattern AP may be defined as the base portion BA. A portion of the support layer SCL covering a top surface GI_T of the gate insulating layer GI may be defined as the base portion BA. The base portion BA may have the form of a plate extending along a plane defined by and/or parallel to a first direction D1 and the second direction D2. A bottom surface BA_B of the base portion BA may contact the top surface AP_T of the active pattern AP. The base portion BA may be disposed at a higher level than the top surface AP_T of the active pattern AP. The bottom surface BA_B of the base portion BA may contact the top surface GI_T of the gate insulating layer GI. The base portion BA may be disposed at a higher level than the top surface GI_T of the gate insulating layer GI. For example, the base portion BA may be the whole upper portion of the support layer SCL disposed at a higher vertical level than the top surface GI_T of the gate insulating layer GI, e.g., in the fourth direction D4.

The support portions SU may protrude from the base portion BA in a direction opposite to a fourth direction D4. The support portions SU may be disposed at a lower level than the base portion BA. A portion of the support layer SCL disposed in the trench TR may be defined as the support portion SU. The level of a boundary BO between the support portion SU and the base portion BA may be equal to the level of the bottom surface BA_B of the base portion BA, the level of the top surface AP_T of the active pattern AP, and the level of the top surface GI_T of the gate insulating layer GI. The support portion SU may be disposed at a lower level than the top surface AP_T of the active pattern AP. The support portion SU may be disposed at a lower level than the top surface GI_T of the gate insulating layer GI. For example, the support portion SU may be the whole lower portion of the support layer SCL disposed at a lower vertical level than the top surface GI_T of the gate insulating layer GI, e.g., in the fourth direction D4.

Opposite side walls SU_S of the support portion SU may contact inner side walls GI_IS of the gate insulating layer GI, respectively. The inner side wall GI_IS of the gate insulating layer GI may oppose an outer side wall of the gate insulating layer GI. The outer side wall of the gate insulating layer GI may contact the active pattern AP. The support portion SU may be disposed between the inner side walls GI_IS of the gate insulating layer GI. The support portion SU may include a first inclined bottom surface SU_B1 and a second inclined bottom surface SU_B2. The level of each of the first and second inclined bottom surfaces SU_B1 and SU_B2 of the support portion SU may be gradually lowered as the each of the first and second inclined bottom surfaces SU_B1 and SU_B2 extends toward the gate insulating layer GI. For example, the level of each of the first and second inclined bottom surfaces SU_B1 and SU_B2 of the support portion SU may be gradually lowered in a horizontal direction approaching the gate insulating layer GI (e.g., in a direction approaching side walls of the trench TR). Each of the first and second inclined bottom surfaces SU_B1 and SU_B2 of the support portion SU may have a lowest level at a portion thereof contacting the gate insulating layer GI. The first and second inclined bottom surfaces SU_B1 and SU_B2 of the support portion SU may contact each other, e.g., at a central area of the trench TR. The level of each of the first and second inclined bottom surfaces SU_B1 and SU_B2 of the support portion SU may be raised as the first and second inclined bottom surfaces SU_B1 and SU_B2 extend toward each other (e.g., in a horizontal direction receding from the side walls of the trench TR). Each of the first and second inclined bottom surfaces SU_B1 and SU_B2 of the support portion SU may have a highest level at a portion thereof where the first and second inclined bottom surfaces SU_B1 and SU_B2 contact each other. The first and second inclined bottom surfaces SU_B1 and SU_B2 of the support portion SU may define the closed empty space SP.

Referring to FIGS. 4A, 4B, 4C and 4D, a mask layer MA may be formed on the support layer SCL. The mask layer MA may include a plurality of first openings OP1. The first openings OP1 of the mask layer MA may extend in the first direction D1. Portions of the top surface BA_T of the base portion BA of the support layer SCL may be exposed by the first openings OP1 of the mask layer MA.

Formation of the mask layer MA may include forming a preliminary mask layer on the support layer SCL, and patterning the preliminary mask layer.

Referring to FIGS. 5A, 5B, 5C and 5D, the support layer SCL may be etched using the mask layer MA as an etch mask. For example, the support layer SCL may be etched through dry etching or wet etching. As the support layer SCL is etched, second openings OP2 may be formed at the support layer SCL. The second openings OP2 may be formed as the first openings OP1 of the mask layer MA are transferred. The second openings OP2 may extend in the first direction D1. The second openings OP2 may penetrate the support layer SCL. The trench TR may be again opened through the second opening OP2. The second opening OP2 may be connected to the empty space SP in the trench TR. Through the second opening OP2, a portion of the top surface of the active pattern AP, a portion of the top surface of the element isolation layer STI, and a portion of the top surface of the gate insulating layer GI may be exposed. The second opening OP2 may be defined by a side wall of the support layer SCL.

Referring to FIGS. 6A, 6B, 6C, 6D and 6E, a gate electrode layer GEL may be formed. Formation of the gate electrode layer GEL may include depositing a conductive material in a direction toward the substrate 100, thereby forming a preliminary gate electrode layer, and removing an upper portion of the preliminary gate electrode layer. For example, the upper portion of the preliminary gate electrode layer may be removed by a chemical mechanical polishing (CMP) process.

In some embodiments, when the upper portion of the preliminary gate electrode layer is removed, an upper portion of the support layer SCL may also be removed. For example, the upper portion of the preliminary gate electrode layer and the upper portion of the support layer SCL may be simultaneously removed by a chemical mechanical polishing (CMP) process. As the upper portion of the preliminary gate electrode layer and the upper portion of the support layer SCL are removed, top surfaces of the gate electrode layer GEL and the support layer SCL may be planarized.

In some embodiments, the gate electrode layer GEL may include or be formed of the same material as the support layer SCL. For example, the support layer SCL and the gate electrode layer GEL may include or be formed of tungsten.

In some embodiments, after formation of the gate electrode layer GEL, an annealing process may be performed to align grains of the gate electrode layer GEL and the support layer SCL.

The gate electrode layer GEL may include an intermediate portion IN interposed between the support layer SCL and the active pattern AP. The intermediate portion IN may overlap with the support layer SCL and the active pattern AP in the fourth direction D4. For example, the intermediate portion IN may vertically overlap with the support layer SCL and the active pattern AP.

The intermediate portion IN may include a first inclined top surface IN_T1 contacting the first inclined bottom surface SU_B1 of the support portion SU of the support layer SCL, and a second inclined top surface IN_T2 contacting the second inclined bottom surface SU_B2 of the support portion SU of the support layer SCL. The first inclined top surface IN_T1 of the intermediate portion IN may be inclined corresponding to the first inclined bottom surface SU_B1 of the support portion SU. The second inclined top surface IN_T2 of the intermediate portion IN may be inclined corresponding to the second inclined bottom surface SU_B2 of the support portion SU. The level of each of the first inclined top surface IN_T1 and the second inclined top surface IN_T2 of the intermediate portion IN may be lowered as each of the first inclined top surface IN_T1 and the second inclined top surface IN_T2 extends toward the gate insulating layer GI (e.g., in a horizontal direction approaching the gate insulating layer GI and/or side walls of the trench TR). Each of the first inclined top surface IN_T1 and the second inclined top surface IN_T2 of the intermediate portion IN may have a lowest level at a portion thereof contacting the gate insulating layer GI. The first inclined top surface IN_T1 and the second inclined top surface IN_T2 of the intermediate portion IN may contact each other. The level of each of the first inclined top surface IN_T1 and the second inclined top surface IN_T2 of the intermediate portion IN may be raised as the first inclined top surface IN_T1 and the second inclined top surface IN_T2 extend toward each other (e.g., in a horizontal direction receding from the side walls of the trench TR). Each of the first inclined top surface IN_T1 and the second inclined top surface IN_T2 of the intermediate portion IN may have a highest level at a portion thereof where the first inclined top surface IN_T1 and the second inclined top surface IN_T2 contact each other (e.g., in a central area of the trench TR).

The gate electrode layer GEL may be formed by depositing a conductive material through the second openings OP2 of the support layer SCL. The gate electrode layer GEL may fill the trench TR. The gate electrode layer GEL may fill the empty space SP in the trench TR. The gate electrode layer GEL may fill the second openings OP2 of the support layer SCL.

Referring to FIGS. 7A, 7B, 7C and 7D, the support layer SCL and the gate electrode layer GEL may be etched. For example, the support layer SCL and the gate electrode layer GEL may be etched through dry etching or wet etching.

In some embodiments, as shown in the drawings, the support layer SCL may be etched such that the support layer SCL is completely removed. In some embodiments, the support layer SCL may be etched such that a portion of the support layer SCL remains, differently from the shown case in the drawings.

As the gate electrode layer GEL is etched, the gate electrode layer GEL may be divided into a plurality of gate electrodes GE. As the gate electrode layer GEL and the support layer SCL are etched, the top surfaces of the active patterns AP and the top surface of the element isolation layer STI may be exposed.

As the support layer SCL and the gate electrode layer GEL are etched, the upper portion of the trench TR may be opened.

Referring to FIGS. 8A, 8B, 8C and 8D, gate capping layers GP may be formed on the gate electrodes GE, respectively. A stack insulating layer 110 may be formed on the active patterns AP, the element isolation layer STI, and the gate capping layers GP.

Bit line structures BT may be formed on the stack insulating layer 110, the active patterns AP and the element isolation layer STI. In some embodiments, formation of the bit line structure BT may include forming a preliminary conductive layer, forming a first contact recess exposing a portion of the active pattern AP while penetrating the preliminary first conductive layer and the stack insulating layer 110, forming a preliminary direct contact layer in the first contact recess, forming a preliminary second conductive layer on the preliminary first conductive layer and the preliminary direct contact layer, forming a preliminary bit line capping layer on the preliminary second conductive layer, patterning the preliminary direct contact layer, the preliminary first conductive layer, the preliminary second conductive layer and the preliminary bit line capping layer, thereby forming a direct contact DC, a first conductive layer CL1, a second conductive layer CL2 and a bit line capping layer BCP, and forming bit line spacers BS on side walls of the direct contact DC, the first conductive layer CL1, the second conductive layer CL2 and the bit line capping layer BCP.

First impurity regions RG1 of the active patterns AP may be formed. The first impurity region RG1 may be formed by doping impurities in a portion of the active pattern AP exposed by the first contact recess before the preliminary direct contact layer is formed in the first contact recess.

Buried contacts BC, landing pads LP, fences 120, and insulating structures IS may be formed. In some embodiments, formation of the buried contacts BC, the landing pads LP, the fences 120, and the insulating structures IS may include forming second contact recesses exposing portions of the active patterns AP while penetrating the stack insulating layer 110, forming a preliminary buried contact layer filling the second contact recesses, patterning the preliminary buried contact layer, thereby forming buried contacts BC, forming fences 120 between the buried contacts BC, forming a preliminary landing pad layer covering the fences 120, patterning the preliminary landing pad layer, thereby forming landing pads LP, and forming an insulating structure IS in a space formed through patterning of the preliminary landing pad layer.

Referring to FIGS. 1A, 1B, 1C and 1D, a capacitor structure CS may be formed on the landing pads LP and the insulating structure IS. Formation of the capacitor structure CS may include forming lower electrodes LE on the landing pads LP, respectively, forming a capacitor insulating layer CI covering the lower electrodes LE, and forming an upper electrode UE.

In the semiconductor device manufacturing method according to the exemplary embodiments of the disclosure, the support layer SCL is formed to support the active pattern AP and, as such, a phenomenon in which the active pattern AP is inclined in a process for forming the gate electrode layer GEL may be prevented.

In the semiconductor device manufacturing method according to the exemplary embodiments of the disclosure, the support layer SCL and the gate electrode layer GEL include or be formed of the same material and, as such, difficulty of a process for polishing and etching the support layer SCL and the gate electrode layer GEL may be alleviated.

Figure 9:
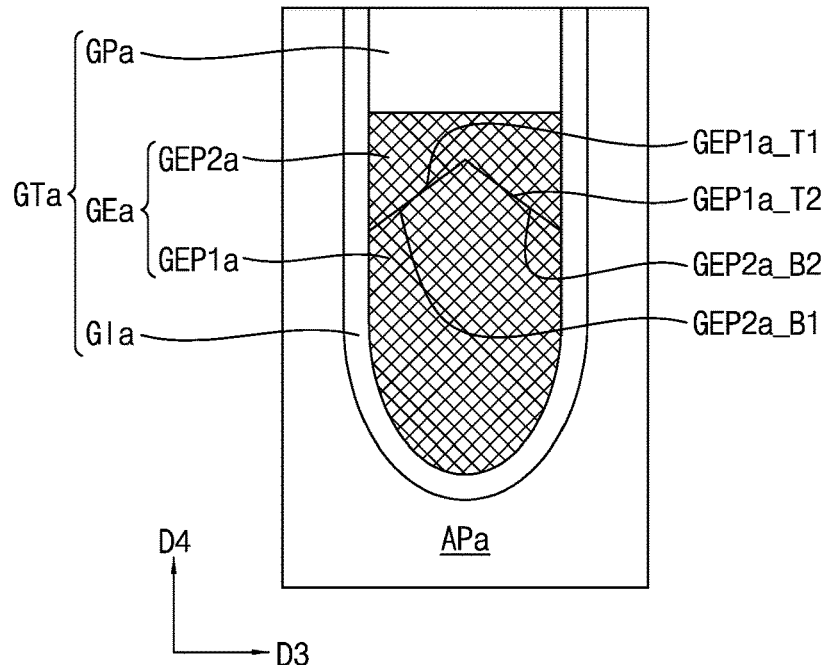
FIG. 9 is a cross-sectional view for explaining a gate structure of a semiconductor device according to some embodiments of the present disclosure.

FIG. 9 is a cross-sectional view for explaining a gate structure of a semiconductor device according to some exemplary embodiments of the disclosure.

Referring to FIG. 9, a semiconductor device 2 may include an active pattern APa, and a gate structure GTa penetrating the active pattern APa. The gate structure GTa may include a gate insulating layer GIa, a gate electrode GEa, and a gate capping layer GPa. The gate electrode GEa may include a first electrode portion GEP1a and a second electrode portion GEP2a. The second electrode portion GEP2a may be provided on the first electrode portion GEP1a.

The entirety of a bottom surface of the second electrode portion GEP2a may contact the first electrode portion GEP1a. The second electrode portion GEP2a may include a first inclined bottom surface GEP2a_B1 and a second inclined bottom surface GEP2a_B2. The first electrode portion GEP1a may include a first inclined top surface GEP1a_T1 and a second inclined top surface GEP1a_T2. The first inclined top surface GEP1a_T1 may contact the first inclined bottom surface GEP2a_B1. The second inclined top surface GEP1a_T2 may contact the second inclined bottom surface GEP2a_B2. The entirety of a bottom surface of the gate capping layer GPa may contact a top surface of the second electrode portion GEP2a.

In some embodiments, the first electrode portion GEP1a and the second electrode portion GEP2a may include or be formed of the same conductive material. For example, the first electrode portion GEP1a and the second electrode portion GEP2a may include or be formed of tungsten. When the first electrode portion GEP1a and the second electrode portion GEP2a include or be formed of the same conductive material, the first electrode portion GEP1a and the second electrode portion GEP2a may be distinguished from each other at a boundary therebetween in terms of crystalline structures thereof. For example, the size/density of a grain boundary provided between the first electrode portion GEP1a and the second electrode portion GEP2a may be relatively greater than the size/density of a grain boundary in the first electrode portion GEP1a (e.g., in the bulk portion or center of the first electrode portion GEP1a) and the size/density of a grain boundary in the second electrode portion GEP2a (e.g., in the bulk portion or center of the second electrode portion GEP2a). Of course, the exemplary embodiments of the disclosure are not limited to the above-described condition, and the first electrode portion GEP1a and the second electrode portion GEP2a may have a continuous/uniform crystalline structure at the boundary therebetween.

In some embodiments, the first electrode portion GEP1a and the second electrode portion GEP2a may include or be formed of different conductive materials from each other. For example, the first electrode portion GEP1a may include or be formed of tungsten, and the second electrode portion GEP2a may include or be formed of molybdenum.

In a process for etching a support layer and a gate electrode layer in a semiconductor device manufacturing method according to some exemplary embodiments of the disclosure, a portion of the support layer may remain, thereby forming the second electrode portion GEP2a of the gate electrode GEa, and a portion of the gate electrode layer may remain, thereby forming the first electrode portion GEP1a of the gate electrode GEa.

Figure 10:
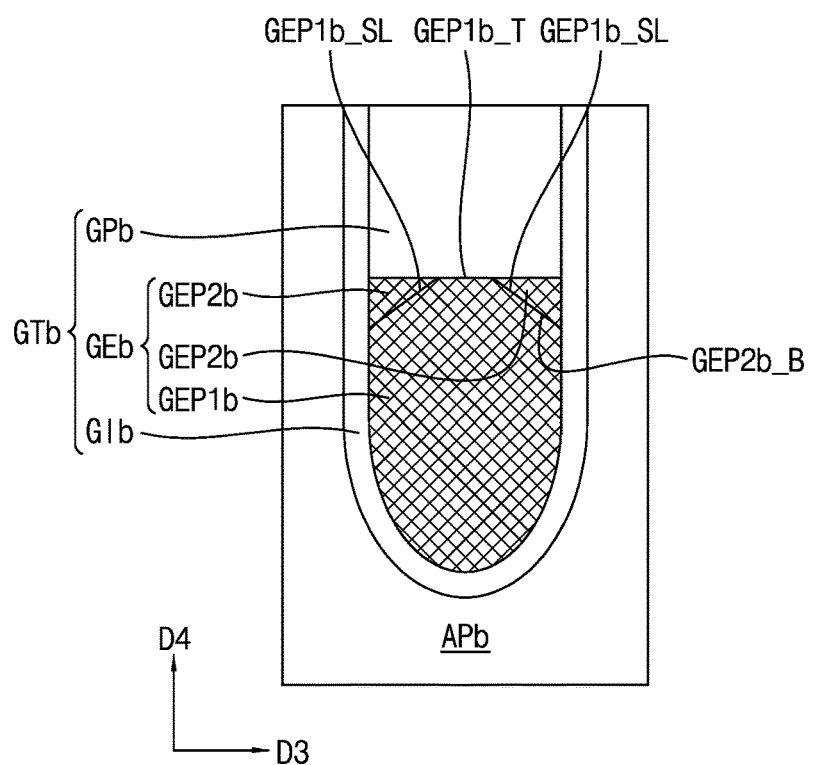
FIG. 10 is a cross-sectional view for explaining a gate structure of a semiconductor device according to some embodiments of the present disclosure.

FIG. 10 is a cross-sectional view for explaining a gate structure of a semiconductor device according to some exemplary embodiments of the disclosure.

Referring to FIG. 10, a semiconductor device 3 may include an active pattern APb, and a gate structure GTb penetrating the active pattern APb. The gate structure GTb may include a gate insulating layer GIb, a gate electrode GEb, and a gate capping layer GPb. The gate electrode GEb may include a first electrode portion GEP1b and second electrode portions GEP2b. The second electrode portions GEP2b may be provided on the first electrode portion GEP1b. The second electrode portions GEP2b may be spaced apart from each other under the condition that the first electrode portion GEP1b is interposed therebetween. For example, the second electrode portions GEP2b may be spaced apart from each other under the condition that an upper portion of the first electrode portion GEP1b is interposed therebetween, e.g., in a horizontal direction.

The second electrode portion GEP2b may include an inclined bottom surface GEP2b_B. The first electrode portion GEP1b may include inclined surfaces GEP1b_SL contacting inclined bottom surfaces GEP2b_B of the second electrode portions GEP2b, respectively. A top surface GEP1b_T of the first electrode portion GEP1b may be provided between the inclined surfaces GEP1b_SL of the first electrode portion GEP1b. Top surfaces of the second electrode portions GEP2b and the top surface GEP1b_T of the first electrode portion GEP1b may contact a bottom surface of the gate capping layer GPb. For example, the top surfaces of the second electrode portions GEP2b and the top surface GEP1b_T of the first electrode portion GEP1b may be at the same vertical level, e.g., in the fourth direction.

In some embodiments, the first electrode portion GEP1b and the second electrode portions GEP2b may include or be formed of the same conductive material. In some embodiments, the first electrode portion GEP1b and each second electrode portion GEP2b may include or be formed of different conductive materials from each other.

Figure 11:
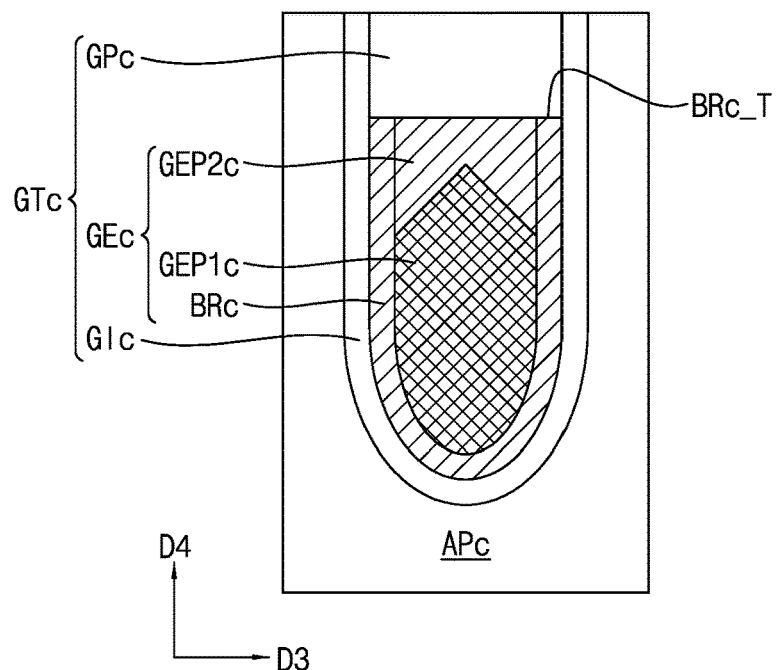
FIG. 11 is a cross-sectional view for explaining a gate structure of a semiconductor device according to some embodiments of the present disclosure.

FIG. 11 is a cross-sectional view for explaining a gate structure of a semiconductor device according to some exemplary embodiments of the disclosure.

Referring to FIG. 11, a semiconductor device 4 may include an active pattern APc, and a gate structure GTc penetrating the active pattern APc. The gate structure GTc may include a gate insulating layer GIc, a gate electrode GEc, and a gate capping layer GPc. The gate electrode GEc may include a barrier portion BRc, a first electrode portion GEP1c, and a second electrode portion GEP2c.

The barrier portion BRc may be provided on the gate insulating layer GIc. The first electrode portion GEP1c may be provided on the barrier portion BRc. The second electrode portion GEP2c may be provided on the first electrode portion GEP1c. The first and second electrode portions GEP1c and GEP2c may be spaced apart from the gate insulating layer GIc by the barrier portion BRc.

A top surface of the second electrode portion GEP2c and a top surface BRc_T of the barrier portion BRc may contact a bottom surface of the gate capping layer GPc.

In some embodiments, the barrier portion BRc and the second electrode portion GEP2c may include or be formed of the same conductive material. For example, the barrier portion BRc and the second electrode portion GEP2c may include or be formed of titanium nitride. When the barrier portion BRc and the second electrode portion GEP2c include or be formed of the same conductive material, the barrier portion BRc and the second electrode portion GEP2c may be distinguished from each other at a boundary therebetween in terms of crystalline structures thereof. For example, the size/density of a grain boundary provided between the barrier portion BRc and the second electrode portion GEP2c may be relatively greater than the size/density of a grain boundary in the barrier portion BRc (e.g., in the bulk portion or center of the barrier portion BRc) and the size/density of a grain boundary in the second electrode portion GEP2c (e.g., in the bulk portion or center of the second electrode portion GEP2c). Of course, the exemplary embodiments of the disclosure are not limited to the above-described condition, and the barrier portion BRc and the second electrode portion GEP2c may have a continuous/uniform crystalline structure at the boundary therebetween.

In some embodiments, the first electrode portion GEP1c may include or be formed of a conducive material different from those of the barrier portion BRc and the second electrode portion GEP2c. For example, the first electrode portion GEP1c may include or be formed of tungsten, and the barrier portion BRc and the second electrode portion GEP2c may include or be formed of titanium nitride.

Figure 12A:
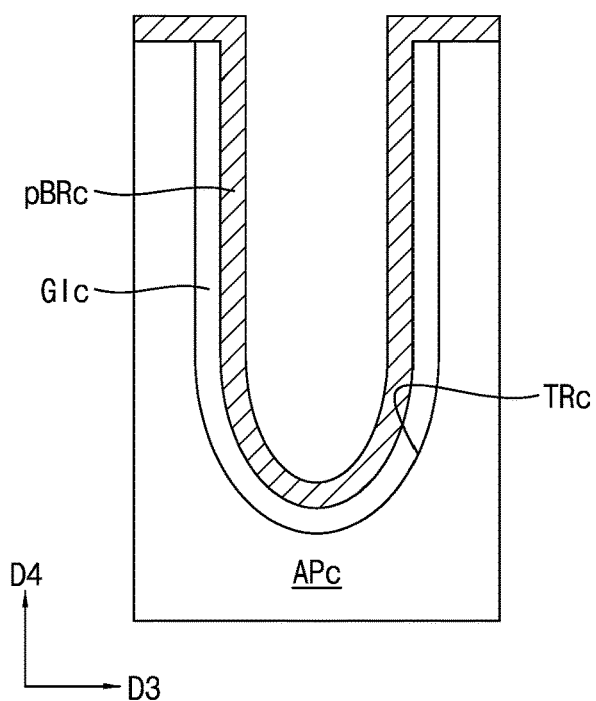
FIGS. 12A, 12B and 12C are cross-sectional views for explaining a method of manufacturing the semiconductor device illustrated in FIG. 11 according to some embodiments of the present disclosure.
Figure 12B:
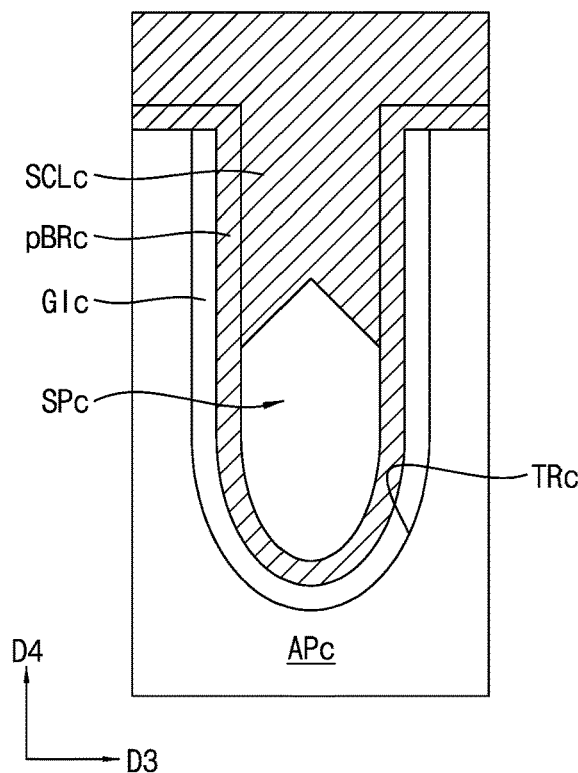
Figure 12C:
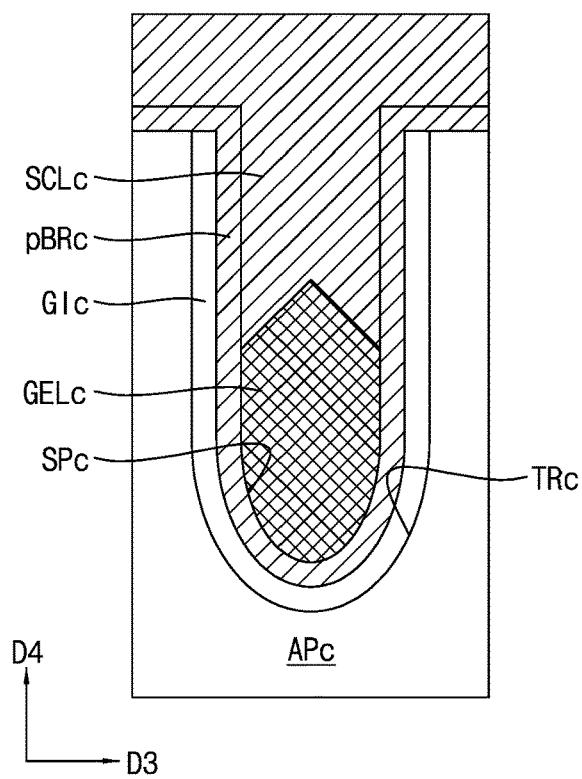

FIGS. 12A, 12B, and 12C are sectional views explaining a method for manufacturing the semiconductor device according to FIG. 11.

Referring to FIG. 12A, a trench TRc penetrating an active pattern APc may be formed. A gate insulating layer GIc may be formed in the trench TRc. A preliminary barrier layer pBRc covering the active pattern APc and the gate insulating layer GIc may be formed. A portion of the preliminary barrier layer pBRc may be formed in the trench TRc.

Referring to FIG. 12B, a support layer SCLc may be formed on the preliminary barrier layer pBRc. In some embodiments, the support layer SCLc may include or be formed of the same conductive material as the preliminary barrier layer pBRc.

The support layer SCLc may close the trench TRc. As the support layer SCLc is formed, a closed empty space SPc may be defined in the trench TRc. The empty space SPc may be defined by surfaces of the preliminary barrier layer pBRc and the support layer SCLc. For example, the closed empty space SPc may be at a vacuum state or may be filled with gas/air.

Referring to FIG. 12C, a gate electrode layer GELc may be formed. Formation of the gate electrode layer GELc may include forming an opening at the support layer SCLc, and forming a gate electrode layer GELc through the opening of the support layer SCLc. The gate electrode layer GELc may completely fill the trench TRc. The gate electrode layer GELc may fill the empty space SPc in the trench TRc.

In some embodiments, the gate insulating layer GELc may include a conductive material different from those of the preliminary barrier layer pBRc and the support layer SCLc.

Referring to FIG. 11, the preliminary barrier layer pBRc, the support layer SCLc, and the gate electrode layer GELc may be etched, thereby forming a gate electrode GEc including a barrier portion BRc, a first electrode portion GEP1c and a second electrode portion GEP2c. The barrier portion BRc may be formed by etching the preliminary barrier layer pBRc, the second electrode portion GEP2c may be formed by etching the support layer SCLc, and the first electrode portion GEP1c may be formed by etching the gate electrode layer GELc.

The semiconductor device manufacturing method according to the exemplary embodiments of the disclosure may include forming a support layer and, as such, difficulty of a process for manufacturing a semiconductor device may be alleviated. For example, the support layer may be beneficial to improve structural stability during the manufacturing process and to improve characteristics of the semiconductor device.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device, comprising:
   an active pattern;
      a trench intersecting the active pattern; and
      a gate structure in the trench,
      wherein the gate structure includes:
         a gate electrode;
         an insulating pattern on the gate electrode; and
         a gate insulating layer between the gate electrode and the active pattern,
      wherein the gate electrode includes:
         a first gate portion; and
         a second gate portion on the first gate portion,
      wherein the active pattern includes:
         a first active portion and a second active portion spaced apart from each other by the trench; and
         a third active portion below the trench,
      wherein the gate electrode is at a lower level than a top surface of the active pattern,
      wherein the first gate portion has an upper surface having a protruding shape in a first direction away from a lower surface of the gate electrode, and
      wherein the second gate portion has a lower surface having a recessed shape in the first direction and contacting the upper surface of the first gate portion,
      wherein a side surface of the first gate portion is vertically aligned with a side surface of the second gate portion, and
      wherein the first gate portion includes a same material as a material of the second gate portion.

2. The semiconductor device of claim 1,
   wherein an upper surface of the insulating pattern and an upper surface of the gate insulating layer are at substantially the same level as a top surface of the active pattern.

3. The semiconductor device of claim 1,
   wherein the first gate portion and the second gate portion comprise tungsten (W).

4. The semiconductor device of claim 1,
   wherein the first gate portion and the second gate portion are distinguished from each other at a boundary therebetween in terms of crystalline structures thereof.

5. A semiconductor device, comprising:
   an active pattern;

a trench intersecting the active pattern; and
a gate structure in the trench,
wherein the gate structure includes:
   a gate electrode;
   an insulating pattern on the gate electrode; and
   a gate insulating layer between the gate electrode and the active pattern,
wherein the active pattern includes:
   a first active portion and a second active portion spaced apart from each other by the trench; and
   a third active portion below the trench,
wherein the gate electrode is at a lower level than a top surface of the active pattern,
wherein the gate electrode includes tungsten (W) and Molybdenum (Mo),
wherein a first gate portion of the gate electrode has an upper surface having a protruding shape in a first direction away from a lower surface of the gate electrode, and
wherein a second gate portion of the gate electrode has a lower surface having a recessed shape in the first direction and contacting the upper surface of the first gate portion.

6. The semiconductor device of claim 5,
wherein the first gate portion includes tungsten (W) and the second gate portion includes Molybdenum (Mo).

7. The semiconductor device of claim 5,
wherein the lower surface of the second gate portion contacts the upper surface of the first gate portion.

8. The semiconductor device of claim 5,
wherein a side surface of the first gate portion is vertically aligned with a side surface of the second gate portion.

9. A semiconductor device, comprising:
an active pattern;
   a trench intersecting the active pattern; and
   a gate structure in the trench,
wherein the gate structure includes:
   a gate electrode; and
   an insulating pattern on the gate electrode; and
   a gate insulating layer between the gate electrode and the active pattern,
wherein the active pattern includes:
   a first active portion and a second active portion spaced apart from each other by the trench; and
   a third active portion below the trench,
wherein the gate electrode is at a lower level than a top surface of the active pattern, and
wherein the gate electrode includes titanium nitride (TiN) and Molybdenum (Mo),
wherein a first gate portion of the gate electrode has an upper surface having a protruding shape in a first direction away from a lower surface of the gate electrode, and
wherein a second gate portion of the gate electrode has a lower surface having a recessed shape in the first direction and contacting the upper surface of the first gate portion.

10. The semiconductor device of claim 9,
wherein the gate electrode includes
a third gate portion on a lower surface and a side surface of the second gate portion.

11. The semiconductor device of claim 10,
wherein the third gate portion contacts the side surface and the lower surface of the second gate portion.

12. The semiconductor device of claim 10,
wherein an upper surface of the first gate portion is at substantially the same level as an upper surface of the third gate portion.

13. The semiconductor device of claim 10,
wherein the first gate portion includes Molybdenum (Mo) and the second gate portion includes titanium nitride (TiN).

14. The semiconductor device of claim 10,
wherein the second gate portion further includes tungsten (W) and the third gate portion includes titanium nitride (TiN).

* * * * *